US011515410B2

(12) United States Patent
LaRoche et al.

(10) Patent No.: US 11,515,410 B2
(45) Date of Patent: Nov. 29, 2022

(54) GROUP III-V SEMICONDUCTOR STRUCTURES HAVING CRYSTALLINE REGROWTH LAYERS AND METHODS FOR FORMING SUCH STRUCTURES

(71) Applicant: Raytheon Company, Waltham, MA (US)

(72) Inventors: Jeffrey R. LaRoche, Austin, TX (US); Kelly P. Ip, Lowell, MA (US); Thomas E. Kazior, Sudbury, MA (US); Eduardo M. Chumbes, Andover, MA (US)

(73) Assignee: Raytheon Company, Waltham, MA (US)

( * ) Notice: Subject to any disclaimer, the term of this patent is extended or adjusted under 35 U.S.C. 154(b) by 129 days.

(21) Appl. No.: 17/085,171

(22) Filed: Oct. 30, 2020

(65) Prior Publication Data

US 2022/0140126 A1    May 5, 2022

(51) Int. Cl.
*H01L 29/778*    (2006.01)
*H01L 29/04*    (2006.01)
(Continued)

(52) U.S. Cl.
CPC .......... *H01L 29/7787* (2013.01); *H01L 29/04* (2013.01); *H01L 29/0843* (2013.01);
(Continued)

(58) Field of Classification Search
None
See application file for complete search history.

(56) References Cited

U.S. PATENT DOCUMENTS

| 7,432,142 B2 | 10/2008 | Saxler et al. |
| 7,692,222 B2 | 4/2010 | Tabatabaie et al. |
| 8,772,786 B2 | 7/2014 | Tabatabaie et al. |

(Continued)

FOREIGN PATENT DOCUMENTS

| CN | 108110054 A | 6/2018 |
| EP | 2 793 269 A1 | 10/2014 |
| GB | 2 239 557 A | 7/1991 |

OTHER PUBLICATIONS

Jia Guo, Guowang Li, Faiza Faria, Yu Coa, Ronghua Wang, Jai Verma, Xiang Gao, Shipping Guo, Edward Beam, Andrew Ketterson, Michael Schuette, Paul Saunier, Mark Wistey, Debdeep Jena, Huili Xing, MBE-Regrown Ohmics in InAlN HEMTs With a Regrowth Interface Resistance of 0.05 Ω •mm, IEEE Electronic Device Letters, vol. 33, No. 4, Apr. 2012, pp. 525-527, 3 pages.

(Continued)

*Primary Examiner* — Khaja Ahmad
(74) *Attorney, Agent, or Firm* — Daly, Crowley, Mofford & Durkee, LLP

(57) ABSTRACT

A Group III-V semiconductor structure having a semiconductor device. The semiconductor device has a source and drain recess regions extending through a barrier layer and into a channel layer. A regrown, doped Group III-V ohmic contact layer is disposed on and in direct contact with the source and drain recess regions. A gate electrode is disposed in a gap in the regrown, doped Group III-V ohmic contact layer and on the barrier layer A dielectric structure is disposed over the ohmic contact layer and over the barrier layer and extending continuously from a region over the source recess region to one side of the stem to portion and then extending continuously from an opposite side of the stem portion to a region over the drain recess region, a portion of the dielectric structure being in contact with the stem portion and the barrier layer.

16 Claims, 34 Drawing Sheets

(51) Int. Cl.
  *H01L 29/08* (2006.01)
  *H01L 29/20* (2006.01)
  *H01L 29/423* (2006.01)
  *H01L 29/45* (2006.01)
  *H01L 29/66* (2006.01)

(52) U.S. Cl.
  CPC ...... *H01L 29/2003* (2013.01); *H01L 29/4236* (2013.01); *H01L 29/452* (2013.01); *H01L 29/66462* (2013.01)

(56) References Cited

U.S. PATENT DOCUMENTS

| | | | |
|---|---|---|---|
| 9,082,772 | B2 | 7/2015 | Williams et al. |
| 9,478,508 | B1 | 10/2016 | LaRoche et al. |
| 10,096,550 | B2 | 10/2018 | LaRoche et al. |
| 10,224,285 | B2 | 3/2019 | LaRoche et al. |
| 10,566,428 | B2 | 2/2020 | LaRoche |
| 2017/0092752 | A1* | 3/2017 | Lu ................... H01L 29/7783 |
| 2019/0006502 | A1 | 1/2019 | Coffie |
| 2019/0097001 | A1* | 3/2019 | LaRoche ............ H01L 29/4175 |
| 2019/0206998 | A1* | 7/2019 | Huang ................ H01L 29/1066 |
| 2019/0348532 | A1* | 11/2019 | Romanczyk ...... H01L 21/02576 |
| 2020/0083167 | A1 | 3/2020 | LaRoche et al. |
| 2020/0127116 | A1* | 4/2020 | Chen ................. H01L 21/0254 |
| 2020/0135865 | A1 | 4/2020 | Radosavljevic et al. |

OTHER PUBLICATIONS

Stefano Tirelli, Diego Marti, Lorenzo Lugani, Marco Malinverni, Étienne Giraud, Jean-François Carlin, Nicolas Grandjean, C.R. Bolognesi, AlInN/GaN HEMTs on SiC and on Silicon with Regrown Ohmic Contacts by Selective Ammonia MBE, CS MANTECH Conference, May 18-21, 2015, pp. 261-264, 4 pages.

Jia Guo, Yu Cao, Chuanxin Lian, Tom Zimmerman, Guowang Li, Jai Verma, Xiang Gao, Shiping Guo, Paul Saunier, Mark Witsey, Debdeep Jena, Huili (Grace) Xing, Metal-face InAlN/AlN/GaN high electron mobility transistors with regrown ohmic contacts by molecular beam epitaxy, Phys, Status Solidi A 208, No. 7, 1617-1619 (2011), p. 1617-1619, 3 pages.

Wojciech Wojtasiak, Marcin Göralczyk, Daniel Gryglewski, Marcin Zajac, Robert Kucharski, Pawel Prystawko, Anna Piotrowska, Marek Ekielski, Eliana Kamińska, Andrej Taube, Marek Wzorek, AlGaN/GaN High Electron Mobility Transistors on Semi-Insulating Ammono-GaN Substrates with Regrown Ohmic Contacts, Micromachines (Basel), Nov. 9, 2018, (11) 546, pp. 1-19, 19 pages.

PCT International Search Report and Written Opinion dated Dec. 14, 2021 for International Application No. PCT/US2021/037380; 21 Pages.

Taiwan Office Action (with Machine English Translation) dated May 18, 2022 for Taiwan Application No. 110122890; 25 Pages.

Invitation to Pay Additional Fees, PCT/US2021/037380, dated Oct. 19, 2021, 16 pages.

K. Shinohara, D. Regan, I Milosavljevic, A.L. Corrion, D.F. Brown, P.J, Willadsen, C. Butler, A. Schmitz, S, Kim, V.Lee, O.Ohoka, P.M. Asbeck, M. Micovic, Electronic Velocity Enhancement in Laterally Scaled GaN DH-HEMTs With $f_T$ of 260 GHz, IEEE vol. 32, No. 8, Aug. 2011, 3 pages.

Andrew J. Green, Neil Moser, Nicholas C. Miller, Kyle J. Liddy, Miles Linquist, Michael Elliot, James K. Gillespie, Robert C. Fitch, Ryan Gilbert, Dennis E. Walker, Jr., Elizabeth Werner, Antonio Crespo, Edward Beam, Any Xie, Cathy Lee, Yu Cao, Kelson D. Chabak, RF Power Performance of Sc(Al,Ga) N/GaN HEMTs at Ka-Band, IEEE vol. 41, No. 8, Aug. 2020, 4 pages.

Response (with Machine English Translation) to Taiwan Office Action dated May 18, 2022 for Taiwan Application No. 110122890; Response filed Jul. 21, 2022; 10 Pages.

* cited by examiner

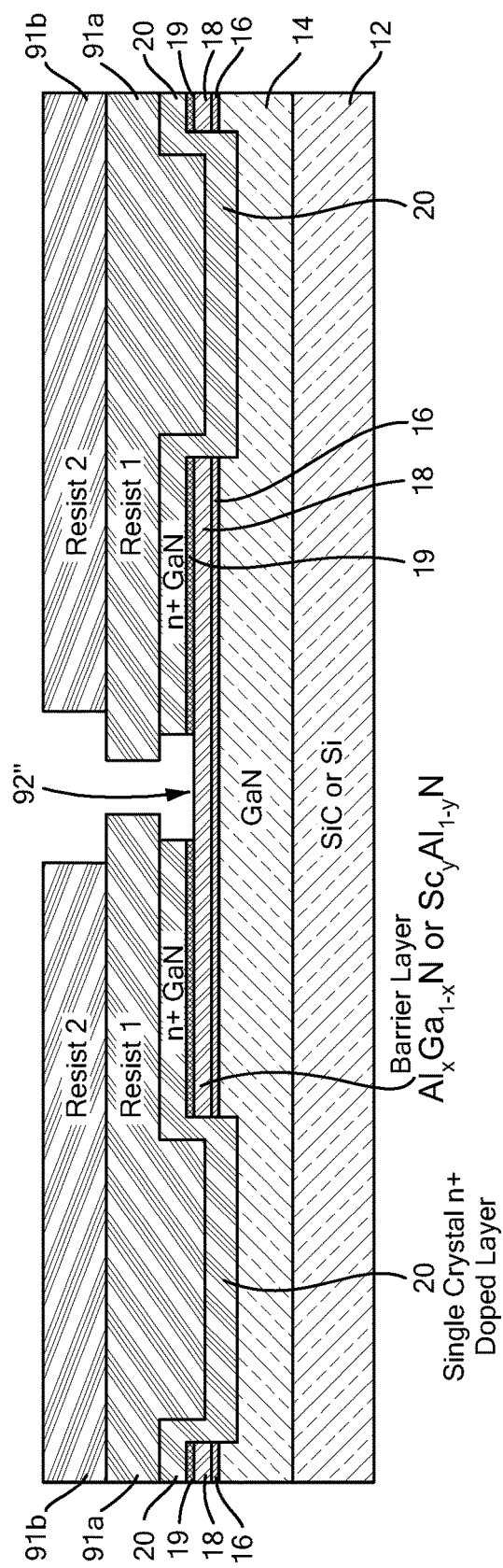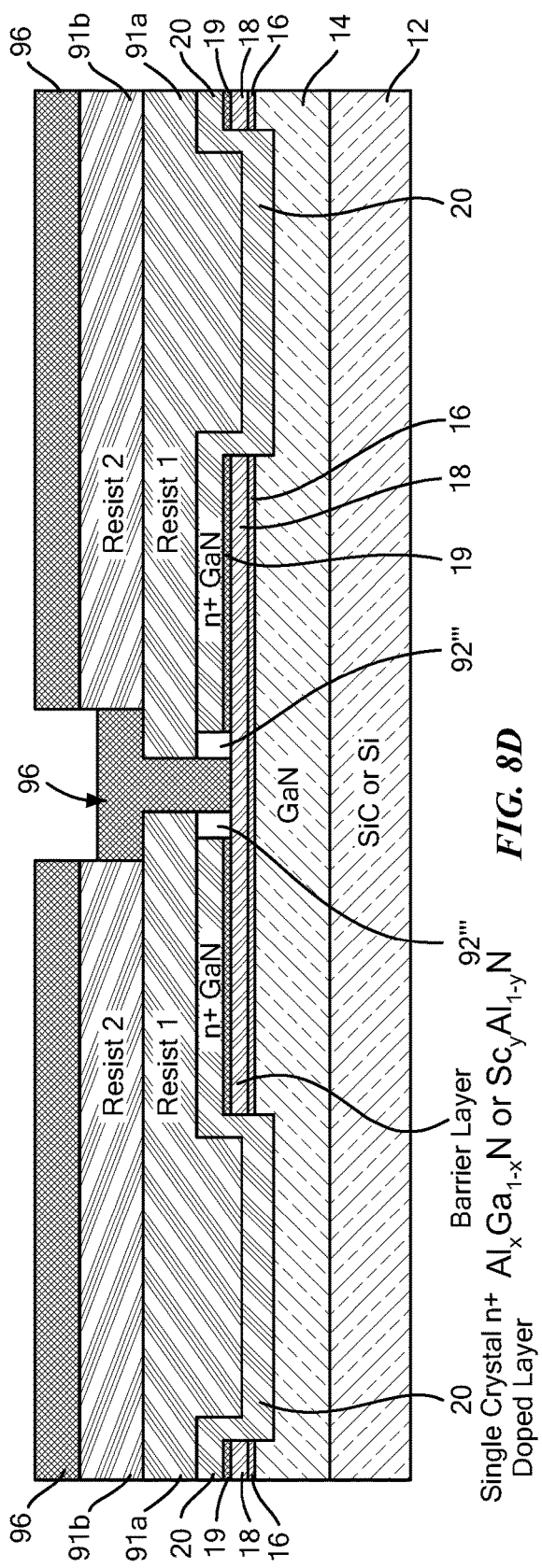

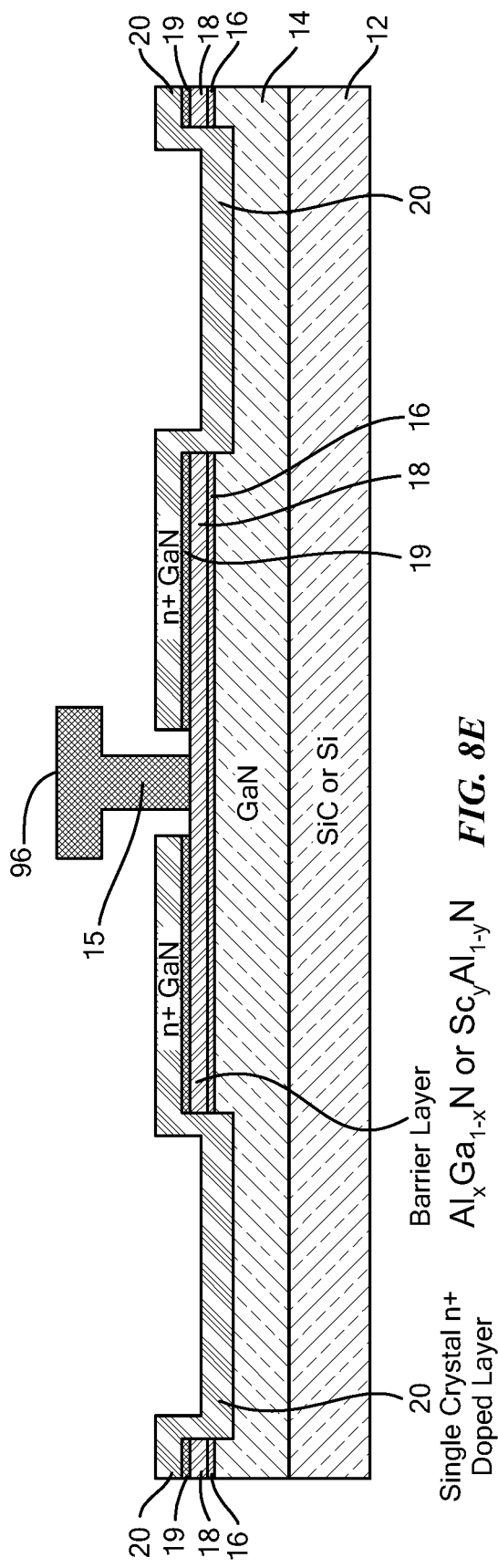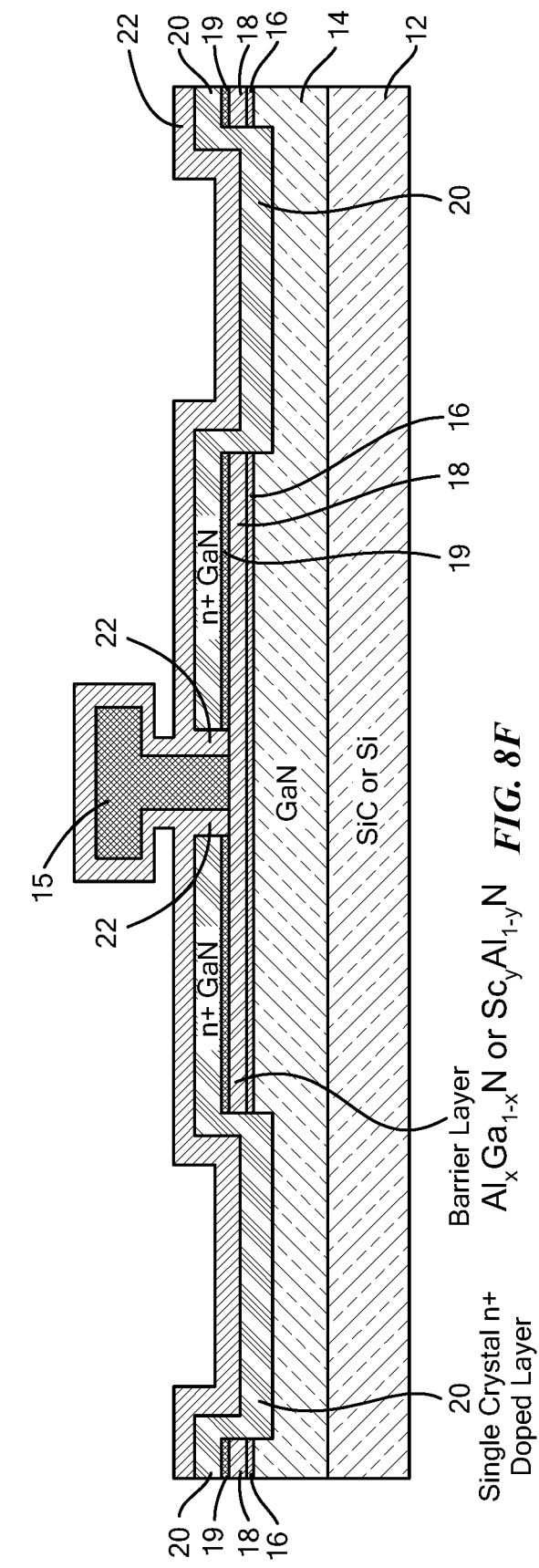

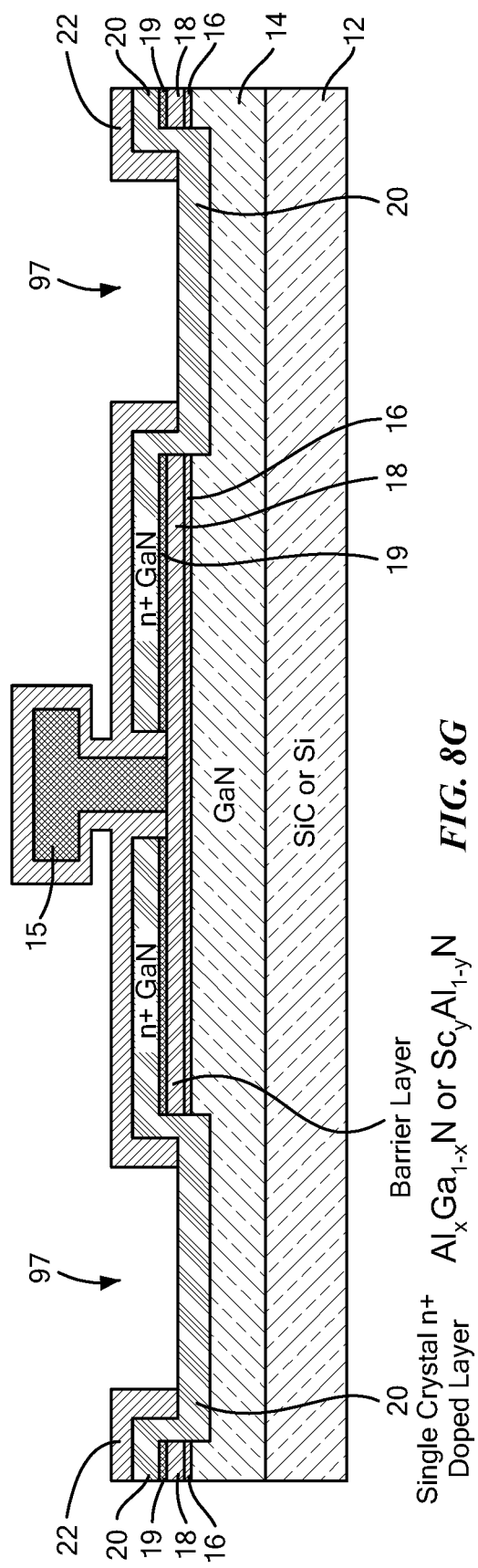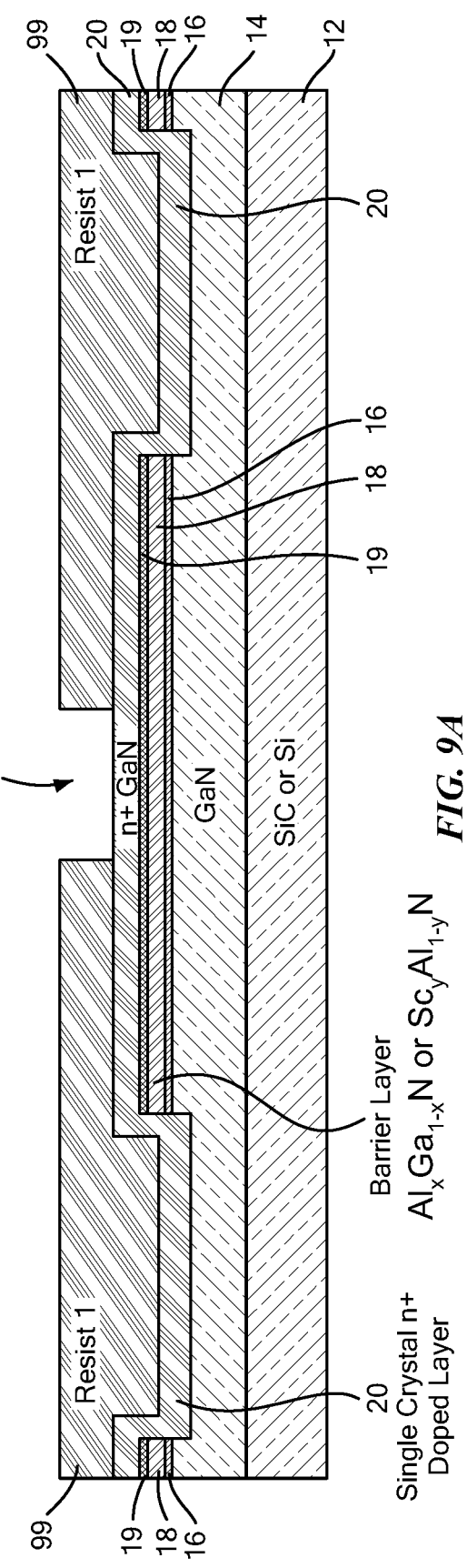

US 11,515,410 B2

GROUP III-V SEMICONDUCTOR STRUCTURES HAVING CRYSTALLINE REGROWTH LAYERS AND METHODS FOR FORMING SUCH STRUCTURES

TECHNICAL FIELD

This disclosure relates generally to Group III-V semiconductor structures having crystalline regrowth layers and methods for forming such structures.

BACKGROUND OF THE INVENTION

As is known in the art, high frequency performance of compound semiconductor high electron mobility transistors (HEMTs) is improved by increased mobility, carrier density, device scaling (e.g. minimizing source/drain gap, and gate length), and minimization of parasitic capacitances and resistances. Additionally, for large signal operation of RF HEMTs, minimization of surface and bulk material trapping is necessary to minimize RF dispersion.

As is also known in the art, gallium nitride (GaN) HEMT material quality, device layer structure, and passivation layers need to be optimized to minimize current collapse, see for example, "Link Between Silicon Nitride Stoichiometry, Vertical Epitaxial Conductivity and Current Collapse in AlGaN/GaN Power Devices" by M. Waller et. al, CS MANTECH, May 2017, Indian Wells, Calif.

As is also known in the art, n+ regrowth layers have been suggested for use as ohmics in Group III-N semiconductor devices to reduce parasitic resistance, see for example, a paper entitled "MBE-Regrown Ohmics in InAlN HEMTs With a Regrowth Interface Resistance of 0.05 Ω·mm" by Guo et al., IEEE Electronic Device Letters, Vol. 33 No. 4 April 2012, a paper entitled "Metal-face InAlN/AlN/GaN high electron mobility transistors with regrown ohmic contacts by molecular beam epitaxy" by J. Guo, Y. Cao, C. Lian, T. Zimmermann, G. Li, J. Verma, X. Gao, S. Guo, Saunier, D. Jena, and H. Xing, *Phys. Stat. Sol.* (A), vol. 208, no. 7, pp. 1617-1619, July 2011, U.S. Pat. No. 7,432,142 B2, Saxler et al, issued Oct. 7, 2008, and U.S. Pat. No. 8,772,786 B2, Tabatabaie et al issued Jul. 7, 2014. More particularly, regrown ohmics are formed by first recessing the ohmic regions through a barrier layer and into an underlying channel layer, thereby exposing the edge of the device two-dimensional electron gas (2 DEG) channel. Subsequently n+ compound semiconductor material is "regrown" over a portion of the surface of the barrier layer with the gate region of the barrier layer being masked by a sacrificial hard mark. The hard mask is then removed thereby exposing the portion of the surface of the barrier layer where the gate electrode is to be formed. A passivation layer is formed over the regrown layer and over the exposed portion of the surface of the barrier layer. The gate electrode is then formed on the exposed portion of the barrier layer.

SUMMARY OF THE INVENTION

In accordance with the present disclosure a method is provided for forming a semiconductor structure having a semiconductor device, comprising: forming a channel layer, the channel layer comprising a Group III-V material; forming a barrier layer on the channel layer, the barrier layer comprising a Group III-V material; forming a vertically recessed source region and a vertically recessed drain regions, such recessed source region and recessed drain region passing though the barrier layer and into the channel layer; growing a doped Group III-V layer in the vertically recessed source region and the vertically recessed drain region, such grown doped Group III-V layer comprising the same material as the channel layer, the doped Group III-V layer extending over a side of the vertically recessed source region and an opposing side of the vertically recessed drain region and extending continuously over the Group III-V barrier layer from the side of the vertically recessed source region to the opposing side of the vertically recessed drain region; forming a dielectric structure over the grown doped Group III-V layer; forming an opening in the dielectric structure to expose a gate region over the surface of the barrier layer; and, forming a gate for the semiconductor device in the opening.

With such method, no mask is used when the doped Group III-V layer is grown; rather after the recessed source and recess drain regions are formed the doped Group III-V layer is grown over the entire structure.

In one embodiment, a dielectric structure is formed over the structure can also serve as a non-sacrificial hard mask to expose a region of the doped Group III-V layer where a gate electrode is to be formed. The exposed region of the doped Group III-V layer is then removed exposing an underlying portion of the barrier layer. Subsequently the gate electrode is formed over the exposed portion of the barrier layer.

In one embodiment, the dielectric layer deposited in contact with the doped Group III-V layer is also the passivation layer in contact with the barrier layer.

In one embodiment the dielectric layer exposes III-V regions outside the device region and wherein the grown doped Group III-V layer is grown on the exposed regions outside the device region.

In one embodiment a portion of the Group III-V layer is monitored by measuring instrumentation during the epitaxial growth of single crystal material in the field (that is, outside of an device region where the device is formed).

In one embodiment, a method is provided for forming a semiconductor structure having a semiconductor device in a device region comprising: forming a channel layer, the channel layer comprising a Group III-V material; forming a barrier layer on the channel layer, the barrier layer comprising a Group III-V material; forming a dielectric layer on the barrier layer, such dielectric layer exposing a source region and a drain region of the semiconductor device; etching a vertically recessed source region and a vertically recessed drain regions in the exposed source region and drain region, such recessed source region and recessed drain region passing through the barrier layer and into the channel layer; growing a doped Group III-V layer in the vertically recessed source region and the vertically recessed drain region and over the dielectric layer, such grown doped Group III-V layer comprising the same material as the channel layer, the doped Group III-V layer extending over a side of the vertically recessed source region and an opposing side of the vertically recessed drain region and extending continuously over the dielectric layer from the side of the vertically recessed source region to the opposing side of the vertically recessed drain; removing a portion of the doped Group III-V layer deposited over the barrier layer; forming an opening in the dielectric layer to expose a gate region over the surface of the barrier layer; and, forming a gate for the semiconductor device in the opening.

With such method, there is no sacrificial mask that is removed. This approach has benefit from both manufacturing and device performance perspectives that will be further described in the following paragraphs.

Thus, the inventors have realized that the manufacturability, yield, and performance of devices with doped Group III-V layer ohmic contacts can be fundamentally addressed by eliminating the use of a sacrificial hard mask during doped Group III-V layer formation. This realization is addressed by two approaches. In these approaches, the doped Group III-V layer is formed either (I) directly on the Group III-V layers of the source and drain regions, the device, and the field (the region outside of the active device region) as a single or poly crystal layer, or by (II) deposition as a single crystal on the III-V source and drain regions and as poly-crystal material directly on the a non-sacrificial hard mask that also functions as the passivation layer of the device. The benefits associated with these two approaches for doped Group III-V ohmic layer formation include the following:

1. Implement the doped Group III-V layer such that it forms ohmic contacts AND part of the device epitaxial structure (Case I): In this approach the n+ doped Group III-V layer is disposed on the ohmic regions and extends above the barrier layer of the device, located between the source and drain regions, and is in contact with one or more epitaxial layers beneath it such that it forms part of the epitaxial structure of the device: extending the single crystal regrown ohmic layer beyond the ohmic contact region and into the access regions of the device for the purpose of (A) minimizing contact resistance, (B) minimizing dispersion, (C) optimizing the access resistance and gate/drain breakdown voltage trade space, and (D) minimizing or eliminating the yield and scaling constraints imposed by polycrystal removal process over the device (as regrown layer can be dealt with through gate recess or gate region recess processes).

2. Eliminating the use of the hard mask in the field during epitaxial growth (Case I): As single crystal material is now formed everywhere in the field (outside of the device region) during epitaxial growth, this in turn facilitates in-situ monitoring and optimization of regrown layer quality during epitaxial growth. This may also minimize the amount of space (such as a window in the hard mask dielectric that exposes the surface of the epitaxial material that is suitable for single crystal growth) that must be set aside/dedicated (and therefore excluded from device formation) to monitoring material quality. When combined with #1 above, polycrystal material formation is completely eliminated. The single crystal material in the field can subsequently be removed post growth to facilitate device isolation, or other such quality, as needed.

3. Silicon-like Subtractive Processing of doped regrowth layers in contact with non-sacrificial hard mask passivation layers (Case II): Si-like subtractive processes (particularly on advanced optical lithography tools) enhance dimensional control for removal of doped Group III-V layer polycrystal material formed over the hard mask passivation layer of the device region and field region. This minimizes the impact on scaling imposed by liftoff techniques or polycrystal etching to a sacrificial mask that then need to be replaced by the device passivation layer.

In one embodiment, a semiconductor structure is provided having a source contact a drain contact and a gate contact disposed between the source contact and the drain contact.

The semiconductor device includes: an epitaxial group III-V channel layer; an epitaxial Group III-V barrier layer disposed over the channel layer; a source recess region and drain recess region extending vertically through the barrier layer and into the channel layer. A doped Group III-V ohmic contact layer disposed on and in direct contact with the source recess region and the drain recess region, such ohmic contact layer being of the same material as the channel layer and being disposed on sidewalls of the source recess region and the drain recess region and having a portion extending horizontally on the barrier layer and having a gap therein between the source recess region and the drain recess region. The gate electrode is disposed in the gap and having on the barrier layer, the gate electrode having a lower, vertically extending stem portion. A dielectric structure is disposed over the ohmic contact layer and over the barrier layer and extending continuously from a region over the source recess region to one side of the stem portion and then extending continuously from an opposite side of the stem portion to a region over the drain recess region, a portion of the dielectric structure being in contact with the stem portion and the barrier layer.

In one embodiment, the dielectric structure includes: a first dielectric layer disposed on and extending over the horizontally extending ohmic contact layer and being in contact with the stem portion; and a second dielectric layer disposed on the first dielectric layer, where the second dielectric layer is a material different from the first dielectric layer, and in is contact with the stem portion and the bottom of a horizontal portion of the gate electrode.

In one embodiment, the dielectric structure comprises: a third dielectric layer and wherein: the first dielectric layer is disposed on and extends over the horizontally extending ohmic contact layer and is in contact with the third dielectric layer; the third dielectric layer is in contact with the stem portion; the second dielectric layer is disposed above the first and third dielectric layers and has a material different from the first dielectric layer and is in contact with the stem portion and the bottom of the horizontal portion of the gate electrode.

In one embodiment, the dielectric structure is disposed on the barrier layer and is in contact with sides of the stem portion and under, and in contact with a bottom portion of the horizontal portion, the bottom portion of the horizontal portion being at a vertical elevation higher than a top surface of the horizontally extending portion of the ohmic contact layer.

In one embodiment, the doped Group III-V layer in contact with the source and drain regions and the barrier layer and the field is deposited as single crystal material.

In one embodiment, a portion of the doped Group III-V layer material in direct contact with a portion of the dielectric structure is polycrystal while a portion of the group III-V layer in the source and drain recessed regions is single crystal In one embodiment the channel layer and the doped Group III-V layer comprise the same material.

In one embodiment the channel layer and the doped layer comprise GaN.

In one embodiment the barrier layer comprises $Al_xGa_{1-x}N$ where x is between 0 and 1.

In one embodiment the barrier layer comprises $Sc_yA_{1-y}N$, where y is between 0 and 0.5.

In one embodiment the barrier layer comprises $Sc_yAl_{1-y}N$, where y is ≥,18. The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

FIG. 1' is a simplified, diagrammatical sketch of a Field Effect Transistor (FET) according to alternative embodiment of the disclosure;

FIGS. 8A-8G are simplified, diagrammatical sketches of the Field Effect Transistor (FET) of FIG. 7 at various stages in the fabrication thereof according to the disclosure; and FIGS. 9A-9C are simplified, diagrammatical sketches of the Field Effect Transistor (FET) of FIG. 7 at various stages in the fabrication thereof according to the disclosure.

Like reference symbols in the various drawings indicate like elements.

DETAILED DESCRIPTION

Figure 1:
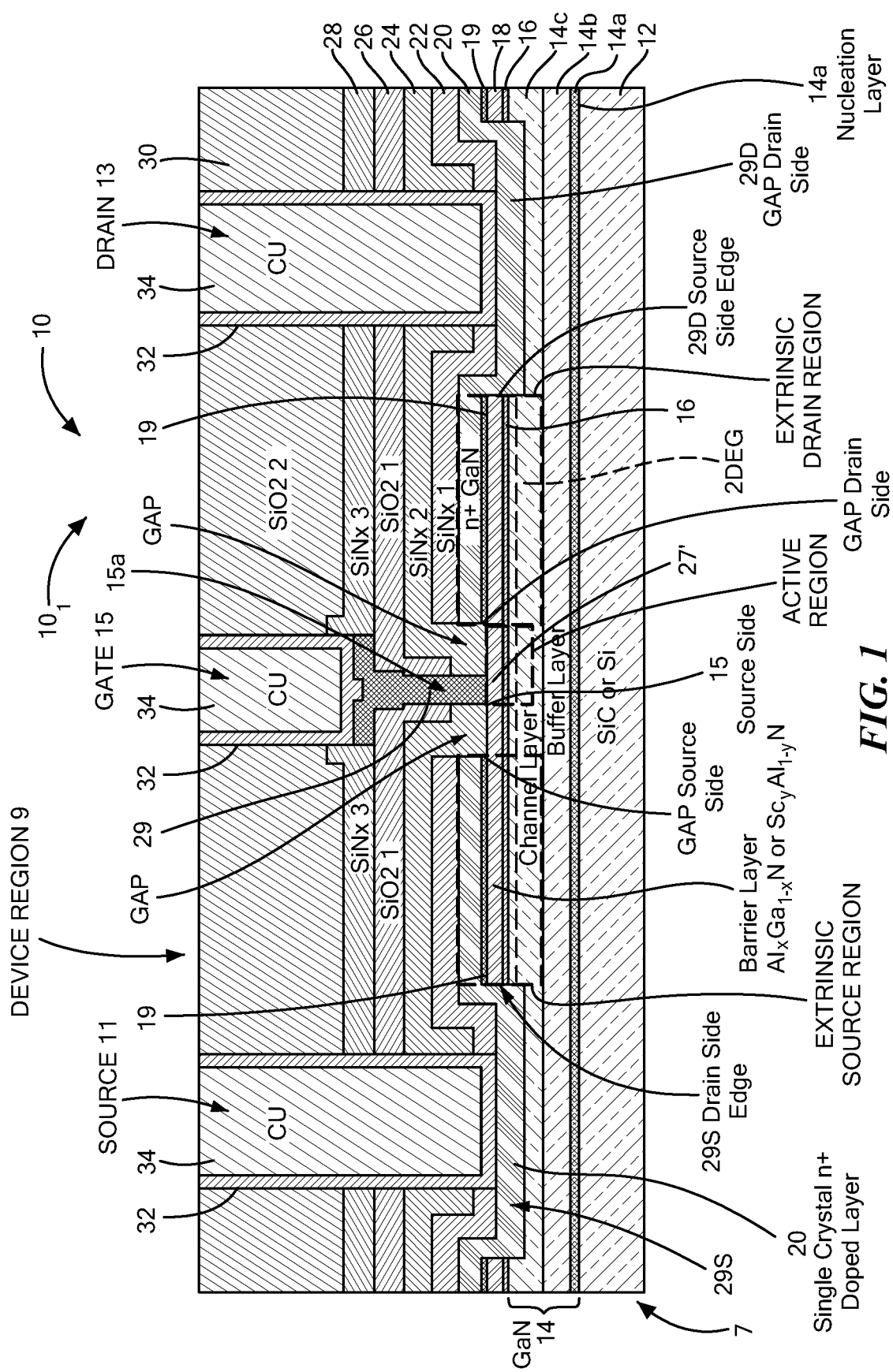
FIG. 1 is a simplified, diagrammatical sketch of a Field Effect Transistor (FET) according to the disclosure.
Figure 1:
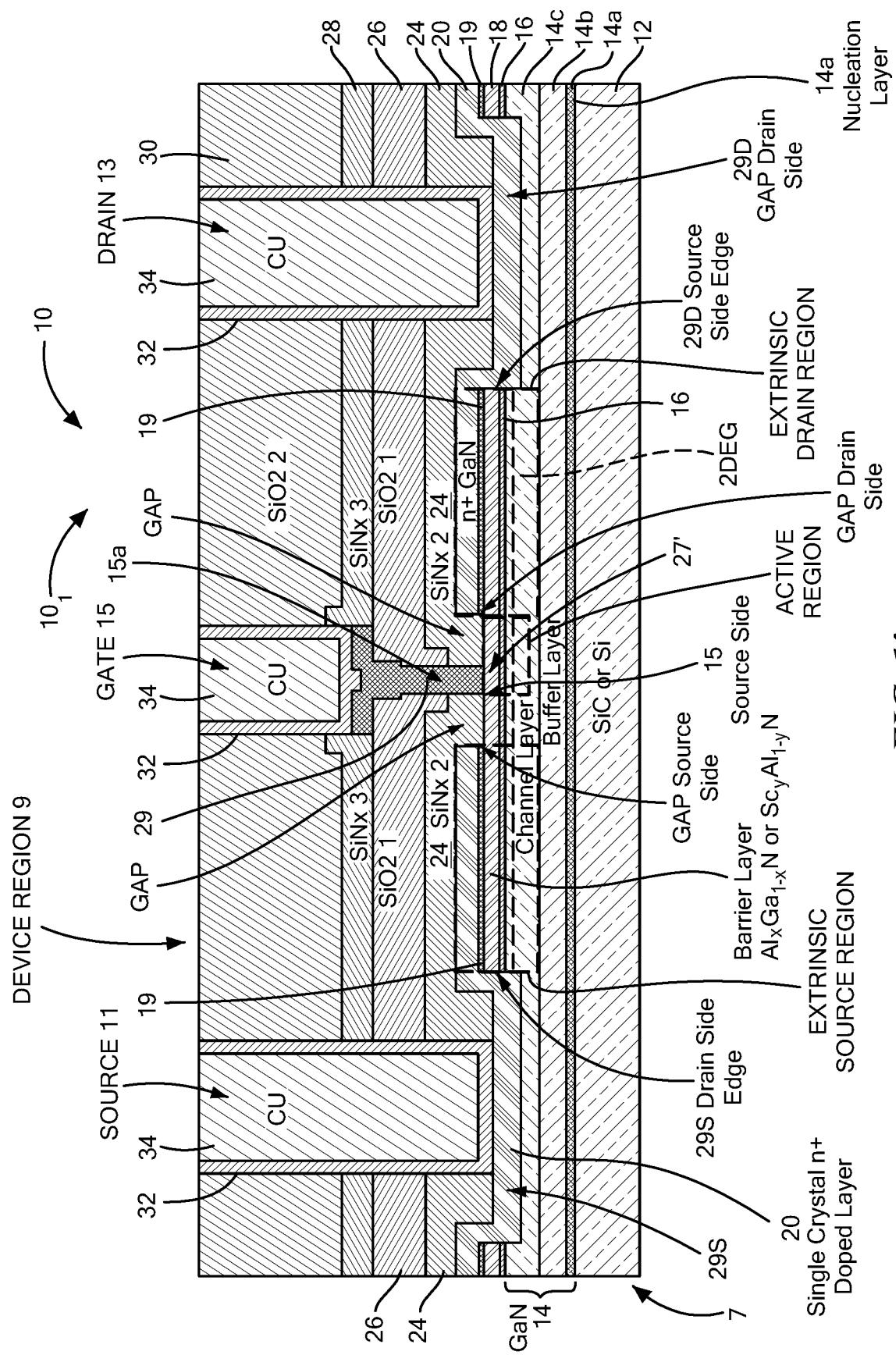

Referring now to FIG. 1, a semiconductor structure 10 is shown having formed therein a semiconductor device $10_1$ here for example, a Field Effect Transistor, here a Group III-V, here for example a Group III-N, High Electron Mobile Transistor (HEMT), formed in an active device region 9 of a semiconductor wafer 7 used to provide a Monolithic Microwave Integrated Circuit (MMIC). The semiconductor device $10_1$ is shown having source electrode 11, a drain electrode 13 and a gate electrode 15 disposed between the source electrode 11 and the drain electrode 13, as shown. It should be understood that the separation between the source electrode 13 and the gate electrode 15 may be different form the separation between the drain electrode 13 and the gate electrode 15.

More particularly, the semiconductor structure 10 includes: a single crystal substrate 12, here for example, silicon (Si) or silicon carbide (SiC), for example; a Group III-N layered structure 14 having a lower nucleation layer 14a, a buffer layer 14b (which extends very close to the substrate 12), and a channel layer 14c, which here for example includes a two dimensional electron gas (2 DEG) channel, successively epitaxially grown on the substrate 12, as shown; an optional aluminum Nitride (AlN) layer 16 with a bandgap larger than the channel layer 14c, here for example serving as a spacer layer to reduce alloy scattering, epitaxially grown on layer 14; a Group III-N barrier layer 18 with a bandgap larger than the channel layer 14c, here for example, Aluminum Gallium Nitride ($Al_xGa_{1-x}N$; where x is between 0 and 1) or Scandium Aluminum Nitride ($Sc_yAl_{1-y}N$, where y is between 0 and 0.5) or a combination thereof, for example epitaxially grown on layer 14; an optional Group III-N cap layer 19, (here for example 50 Angstroms thick) epitaxially grown on layer 18, here for example a doped or undoped GaN Cap layer, helping to minimize/eliminate trapping effects at the interfaces between cap layer 19, barrier layer 18, and doped Group III-V layer 20. Here for example doped Group III-V layer 20 is GaN and is doped with silicon (Si) at $>10^{19}/cm^3$. It is noted that portions of the doped Group III-V layer 20 are grown epitaxially on barrier layer 18 (or optional Group III-N cap layer 19 if present) and is deposited on the GaN layer 14 in the source and drain region, as shown; a dielectric structure having: a dielectric layer 22, here $SiN_X$ on doped Group III-V layer 20; a dielectric layer 24, here $SiN_X$ on layer 22 and on portions of barrier layer 18 in the gate region, as shown; a dielectric layer 26, here $SiO_2$ on layer 24; a dielectric layer 28, here $SiN_X$ on layer 26; and dielectric layer 30, here $SiO_2$, on layer 28, as shown. It is noted that dielectric layer 24, here SiNx, serves as the passivation layer as it is in direct contact with the barrier layer 18 near gate electrode 15. It is also noted that 18% Sc (y=0.18) $Sc_yAl_{1-y}N$ is lattice matched to GaN, so 18% Sc is a suitable choice for the barrier layer 18, or a portion of the barrier layer 18, of $Sc_yAl_{1-y}N$ HEMTs. As the etch selectivity of other III-N layers to relative $Sc_yAl_{1-y})N$ increases with Sc content (though 18% Sc can be selectively etched too), higher concentrations≥18% Sc may be used as etch stop layers, here for example 1.5 nm, that only comprise a portion of barrier layer 18.

The source and drain electrode 11, 13 are here Damascene structures having a TiN, Ta, Ta/Cu or Ta/TaN/Cu or TaN/Cu or TiN/Cu, or other combination of these metals, adhesion and barrier layer 32 which pass through dielectric layers 22, 24, 26, 28 and 30, as shown and are in ohmic contact with the doped Group III-V layer 20 and copper (Cu) fill 34, which may alternately be tungsten (W), as shown. It is noted that TiN, Ta, TaN, Ta/TaN or other combination of these materials, serve as both adhesion layers and Cu diffusion barrier materials.

The gate electrode 15 has: a lower stem portion 15a that passes through dielectric layers 28, 26, 24 and 22 and through n+ GaN single crystal regrown doped Group III-V layer 20 and through optional Group III-N cap layer 19 (if present) and is in Schottky contact with the Group III-N barrier layer 18; and an upper Damascene structure having a Ta or Ta/TaN or TaN or TiN, or combination thereof, adhesion and barrier layer 32 which pass through dielectric layers 28 and 30, as shown and a copper (Cu) fill 34, as shown.

It is noted that the structure 10 has vertically recessed source and drain regions 29S, 29D, with a bottom in the channel layer 14c, as shown, with vertical extending (e.g., vertical or sloped) side walls extending to the top of barrier layer 18 (or cap layer 19, if present). It is also noted that doped Group III-V layer 20 is disposed in on, and in direct contact with the bottom of the recessed source and drain regions 29S, 29D, and on the vertically extending side walls and extending horizontally over the barrier layer 18 (and over the cap layer 19, if present) and extending into an EXTRINSIC SOURCE REGION which extends from a drain side edge 29S DRAIN SIDE EDGE (FIG. 1) of the source recess 29S to an edge GAP SOURCE SIDE of the GAP and an EXTRINSIC DRAIN REGION which extends from an opposing edge GAP DRAIN SIDE of the GAP to an source side edge 29D SOURCE SIDE EDGE of the drain recess 29D of the semiconductor device 10₁. Here, in this example the EXTRINSIC SOURCE REGION and the EXTRINSIC DRAIN REGION are both a length at least 40 nm, and terminate at the GAP in the Group III-V layer 20, as shown. It is noted that an ACTIVE REGION (FIG. 1) extends from the source side 15 Source Side edge of the gate electrode 15 to the edge of the GAP DRAIN SIDE edge on the drain side of the gate electrode 15.

In accordance with the invention the horizontal portion of the Group III-V layer 20 disposed over the EXTRINSIC SOURCE REGION and EXTRINSIC DRAIN REGION of device $10_1$ structure 10 are designed to modify device $10_1$ function by providing a leakage path to minimize dispersion (current collapse) related to surface and buffer traps while optimizing the trade space between source/drain gap distance (as smaller source to drain gaps, which in turn reduces parasitic source to drain resistance, are enabled by the present invention) and breakdown voltage of device $10_1$ (which increases with GAP width relative to the drain side of the gate and gate to drain distance). Additionally, proper design of the doped Group III-V layer 20 enables further optimization of access region resistances.

Figure 1A:
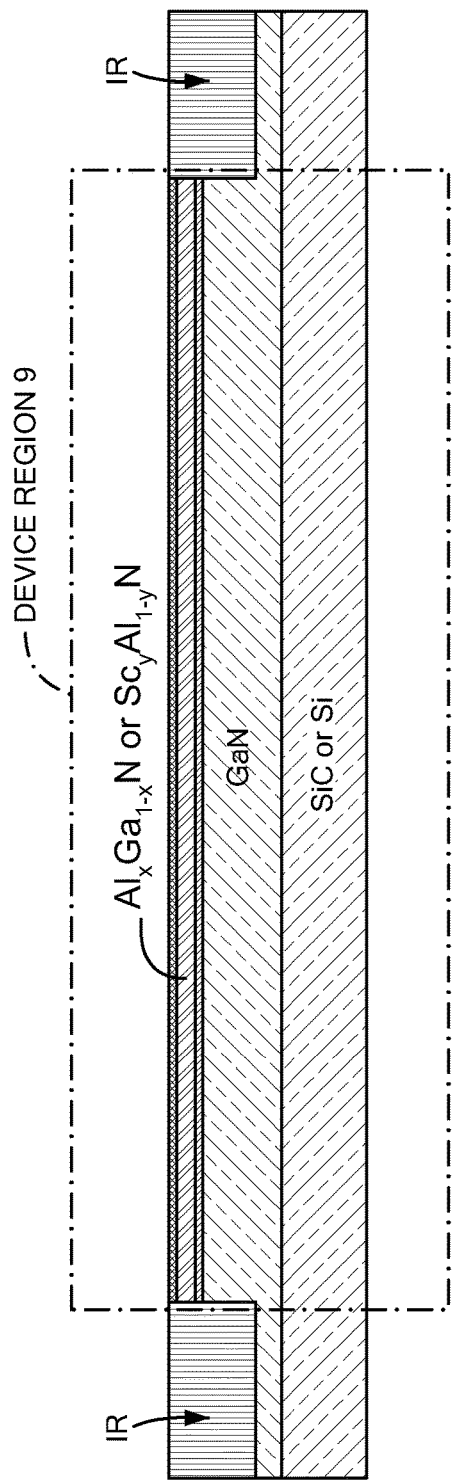
FIGS. 1A", 1A''', 2A, 2B, 2C, 2C', 2C'', 2D, 2D', 2E, 2E', 2F, 2F'-2Q are simplified, diagrammatical sketches of the Field Effect Transistor (FET) of FIG. 1 at various stages in the fabrication thereof according to the disclosure.
Figure 1A:
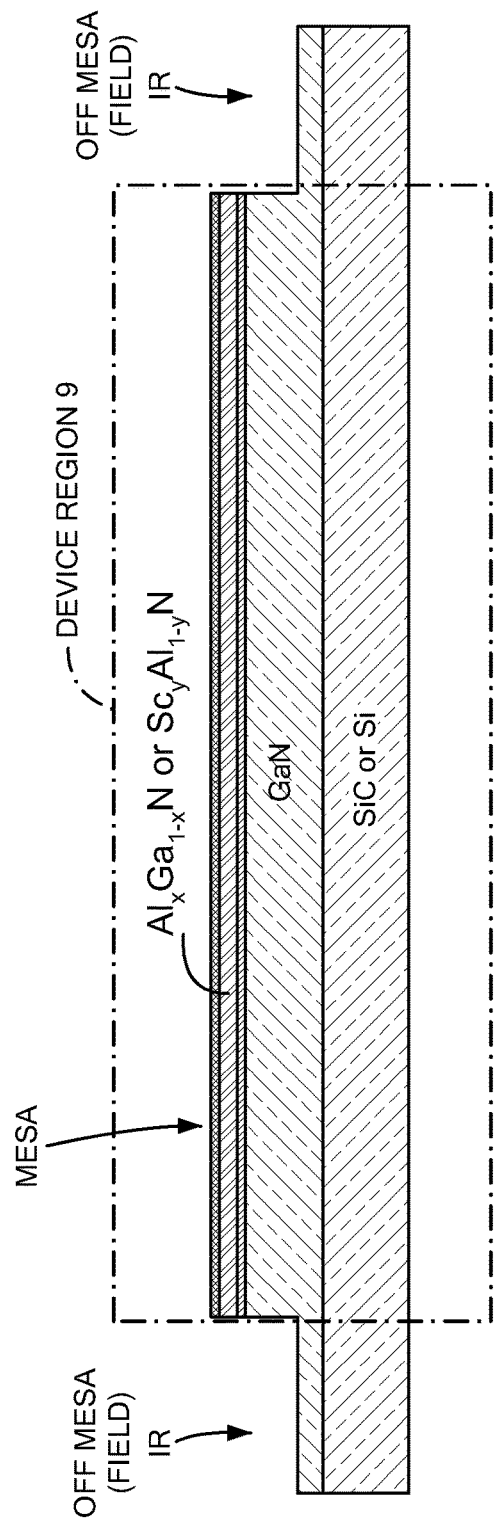

It is first noted that typically, the wafer 7 would have many HEMTs (semiconductor devices $10_1$) each separated by isolation regions formed as follows: Referring now to FIGS. 1', 1A", and 1A'", FIG. 1' show the wafer 7 having substrate 12, such substrate 12 having the GaN layer 14, the optional AlN layer 16 thereon, the Group III-N barrier layer 18 hereon, and the optional GaN cap layer 19 thereon, as shown. A mask M1 (FIG. 1A) is formed over the wafer to cover device $10_1$ and field region 9' of the structure, as shown. The mask M1 is used to expose isolation regions IR (FIG. 1A") around device region 9 here using ion implantation indicted by the arrows or by etch into the wafer to form the boundary of device 10 (equivalent to the mesa edge of devices with mesa isolation). The mask M1 is then removed as shown in FIG. 1A". It is noted that the isolation of device $10_1$ may also be provided using a chlorine-based plasma dry etch to form mesas (FIG. 1A'"). It is also noted that the bottom of the isolation region IR is located below the 2 DEG level (FIG. 1).

Next, a method to form device $10_1$ will be described in FIGS. 2A, 2A; 2A", and 2B-2Q.

Figure 2A:
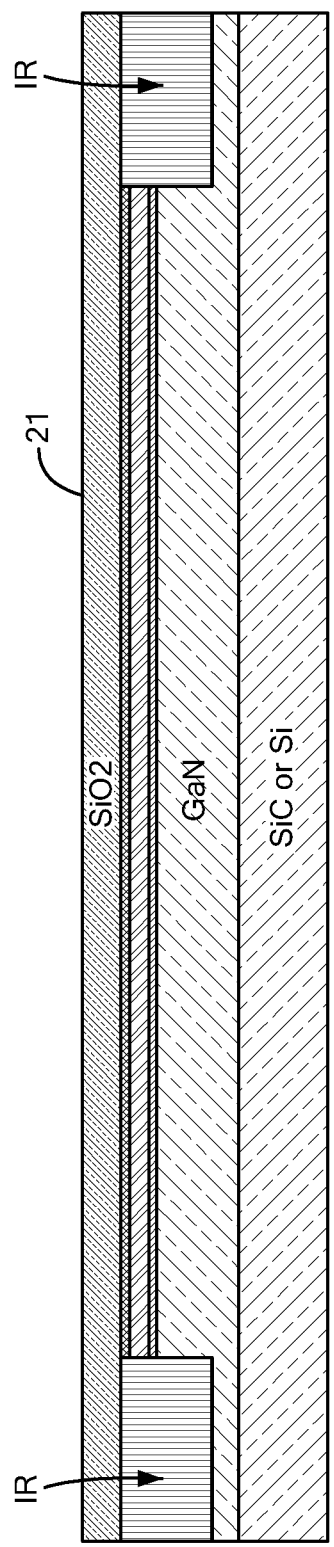
Figure 2B:
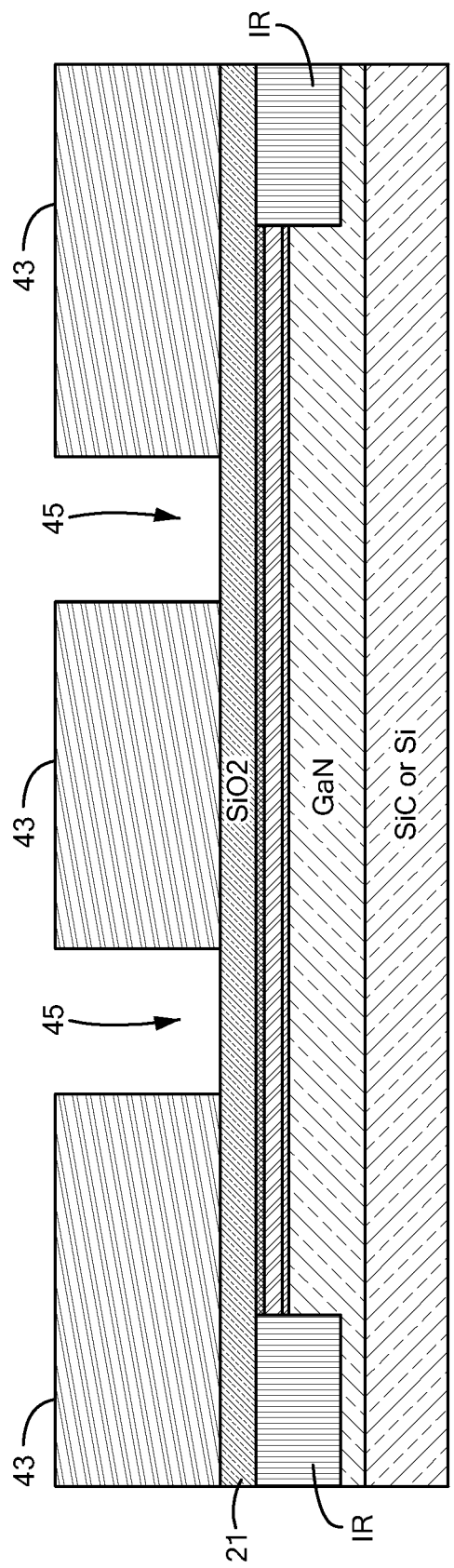

Referring to FIG. 2A, a dielectric layer 21, here for example SiO₂, is deposited as shown. A soft mask 43 (FIG. 2B), here for example a resist mask, is applied to the surface of the dielectric layer 21 with windows 45 there to expose regions of the structure shown in FIG. 2B where the source region 29S and drain regions 29D are to be formed. The mask 43 and portions of the structure exposed by windows 45 are exposed to a fluorine-based plasma dry etch or wet etch or combination of thereof to form openings 21' thereby exposing the surface of the optional cap layer 19 (if present) or Group III-N barrier layer 18. Then a chlorine-based dry etch sequentially etches through layers 19 (if present), 18, 16 (if present) and removes an upper portion of layer 14; it also being noted that the portion of the layer 14 removed are regions where the source and drain electrodes 11, 13 (FIG. 1) are to be formed. Resist can be used as the mask 43 during the duration of the entire etch through layers 21,19 (if present), 18, 16 (if present) and into layer 14, or it can be removed after the fluorine-based etch of layer 21, as SiO₂ can be used as a hard mask with windows 45' (FIG. 2C) therein for chlorine-based plasma dry etches of the layers 19 (if present), 18, 16 (if present), and into layer 14. It is also noted that layer 21 is patterned to provide a mask with windows 45', as will be seen a sacrificial mask 21' (FIG. 2C).

Figure 2C:
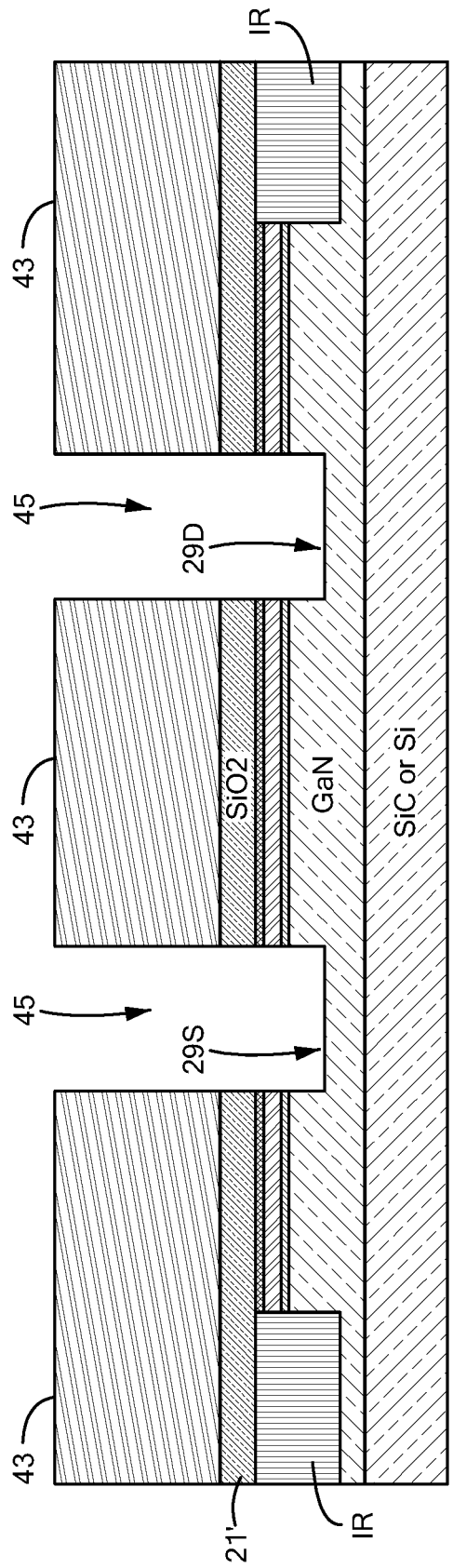
Figure 2C:
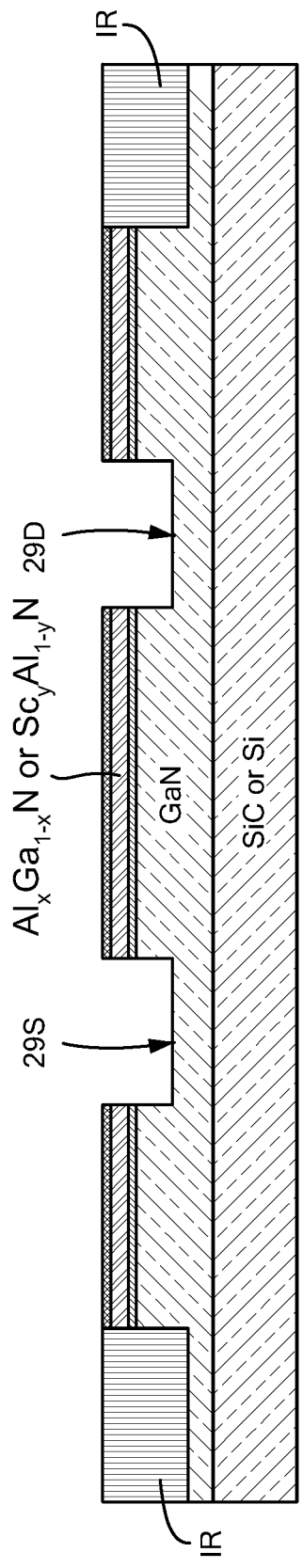
Figure 2C:
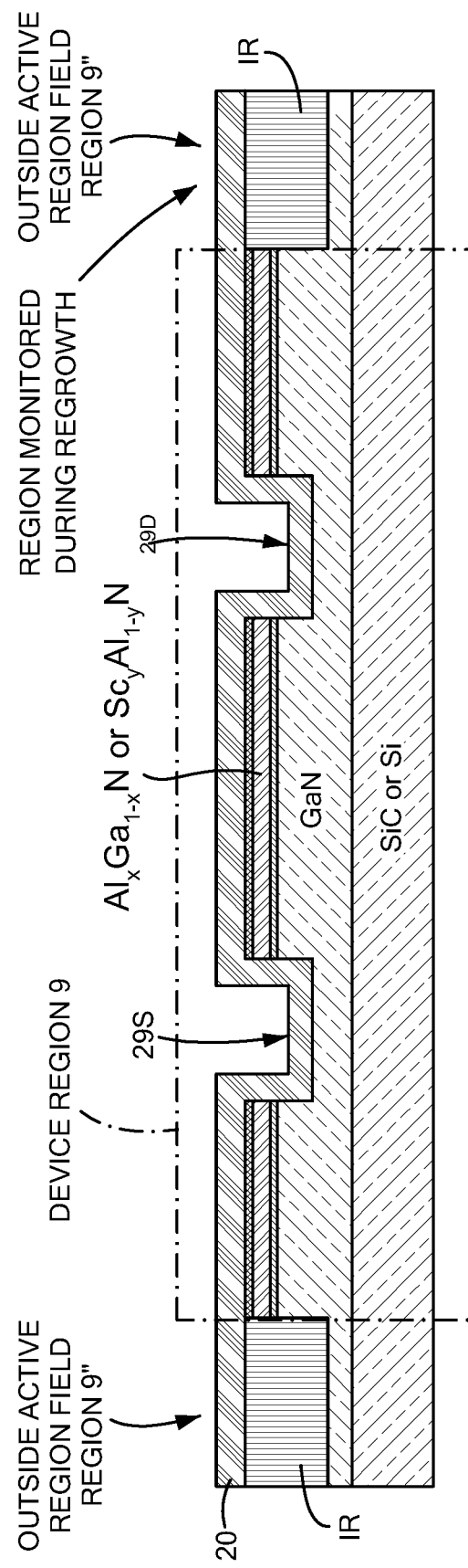

Referring to FIG. 2C, with the sacrificial mask 21' formed as described from layer 21 and with or without mask 43 remaining along with the sacrificial mask 21', (the remaining portions of layer 21) a fluorine-based dry etch or wet etch or combination of thereof thereby completes the formation the source and drain recessed regions 29S, 29D and exposing the top surface of the epitaxial layers. The sacrificial mask 21' (layer 21) along with mask 43, if used, are removed as shown in FIG. 2C'.

Figure 2D:
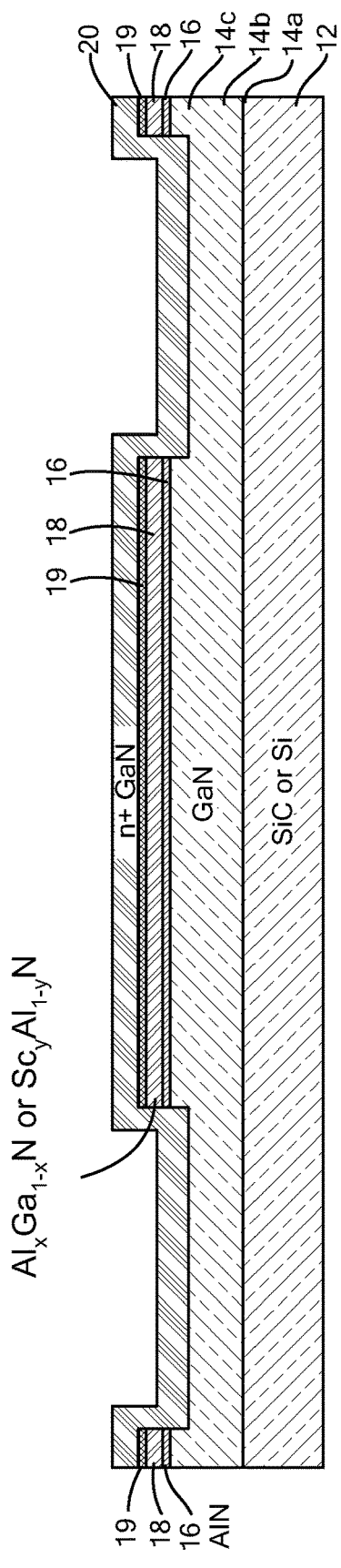
Figure 2D:
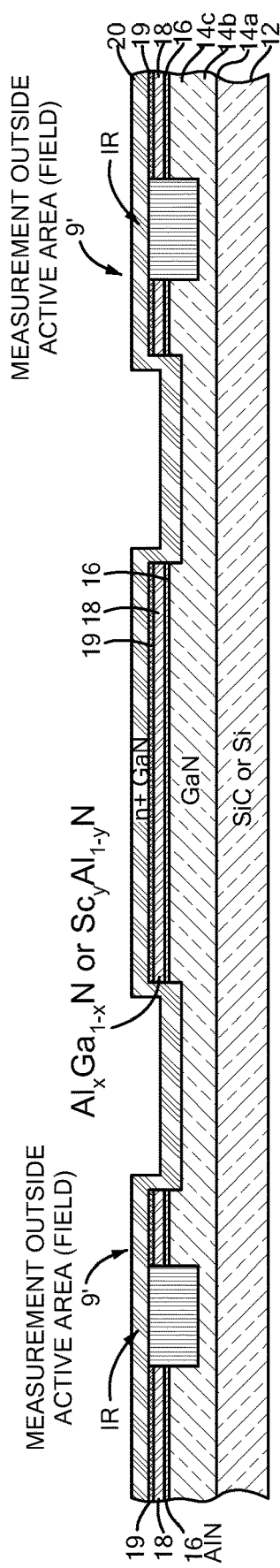

Referring now to FIG. 2C", the doped Group III-V layer 20 is then deposited by any suitable technique such as molecular beam epitaxy (MBE), metal organic chemical vapor deposition (MOCVD), or other technique such as low temperature crystalline atomic layer deposition (ALD), as shown in FIG. 2D. It is noted that the monitoring of the growth quality is by observing reflection high-energy electron diffraction (RHEED) measurements during the MBE growth performed outside device $10_1$ area; that is, it is performed in the larger area field region 9' (FIG. 2D'). It is noted that doped Group III-V layer 20 is disposed on the bottom of the recessed source and drain regions 29S, 29D and on the vertically extending (e.g., vertical or sloped) side walls of the source and drain regions with the channel layer having the two-dimensional electron gas (2 DEG) disposed between the recessed source and drain regions, with portions of the doped single crystal layer being disposed on the vertically extending (e.g., vertical or sloped) sides of the recessed source and drain regions and extending horizontally on the channel layer and having the GAP (FIG. 1) therein to expose a gate region, such doped Group III-V layer 20 being formed at a temperature≥650° C. if MBE or MOCVD are used.

It is noted that the grown doped Group III-V layer extends over a side of the vertically recessed source region and an opposing side of the vertically recessed drain region and extending continuously over the Group III-V barrier layer from the side of the vertically recessed source region to the opposing side of the vertically recessed drain region.

Figure 2E:
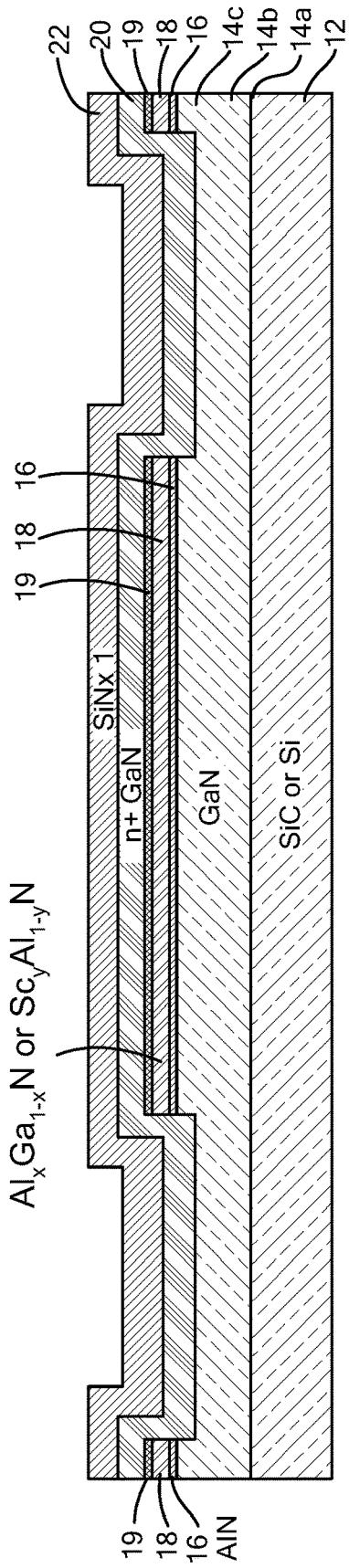
Figure 2E:
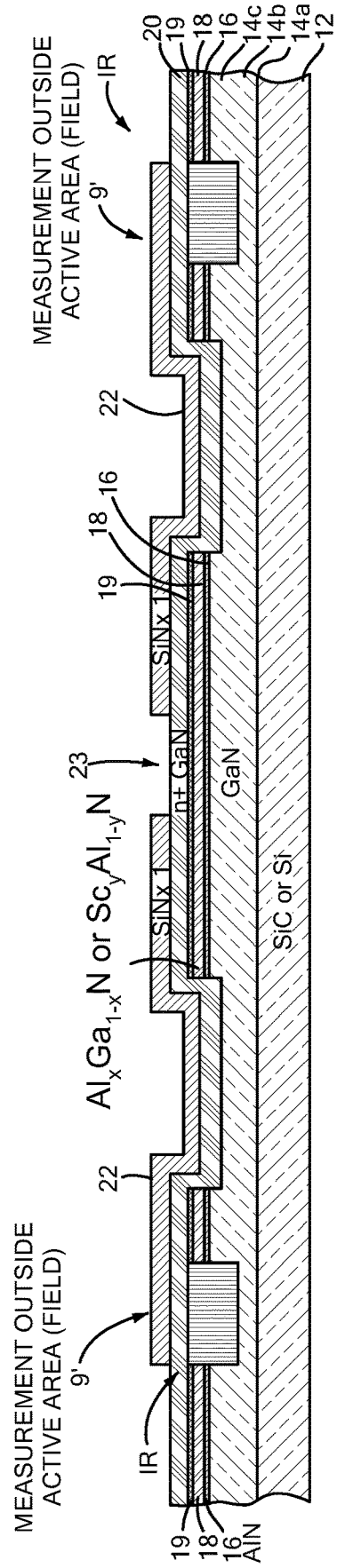

Referring now to FIGS. 2E and E', the dielectric layer 22, here for example SiNx, is conformally deposited by any suitable technique such as plasma enhanced chemical vapor deposition (PECVD), low pressure chemical vapor deposition (LPCVD), or sputtering over the doped Group III-V layer 20, as shown.

Figure 2F:
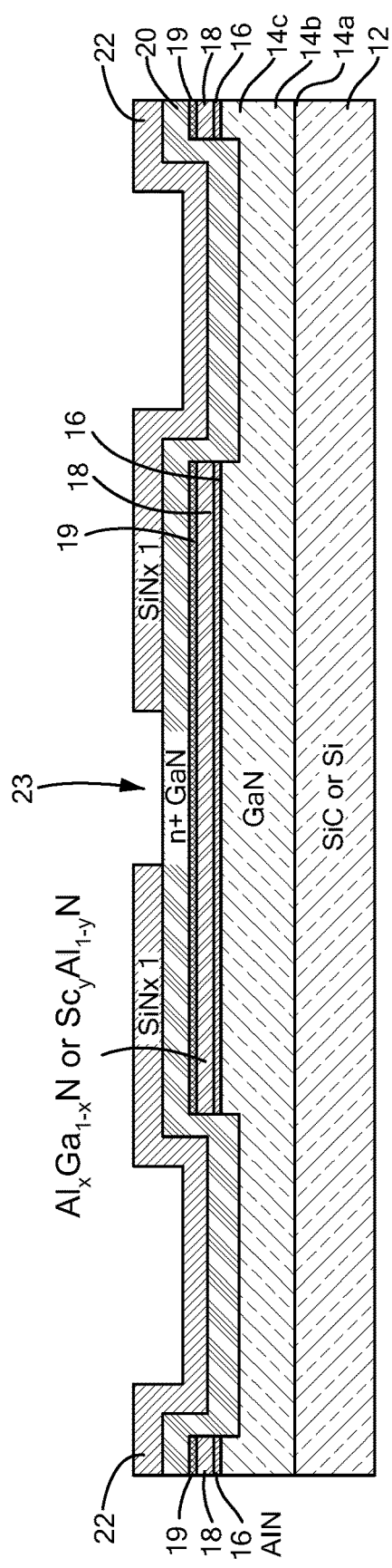
Figure 2F:
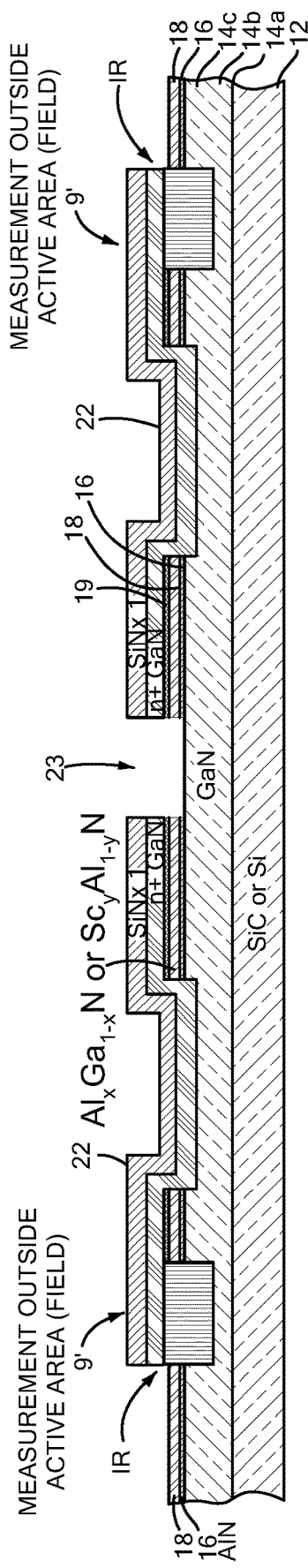
Figure 2G:
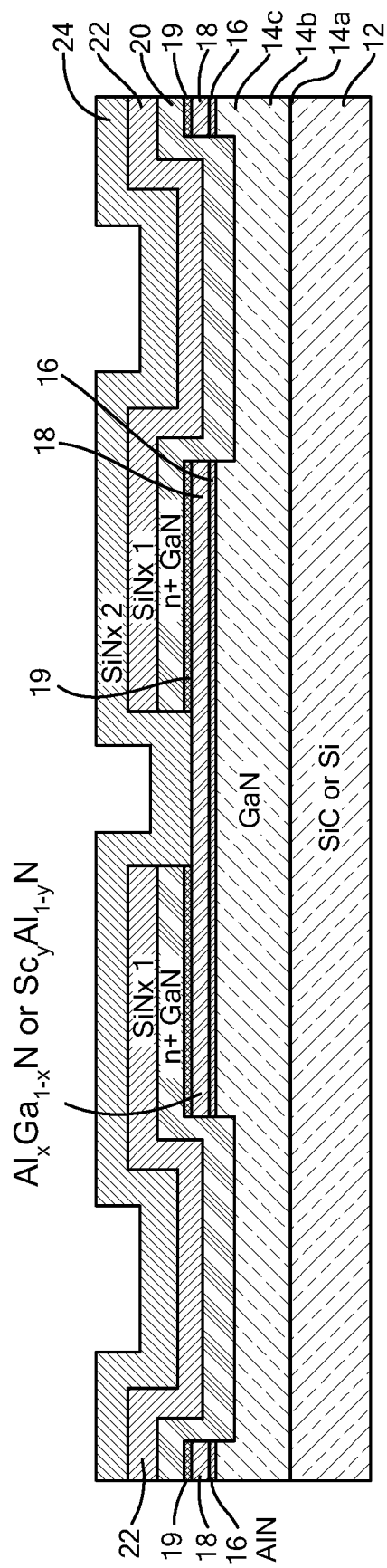

Referring now to FIGS. 2F and 2F', the portion of the regrown layer over the gate region (the area where the gate will be formed) and the portion of the regrown layer 20 over the regions 9' outside of the active regions are defined by forming openings 23 through a portion of dielectric layer 22, using lithographic patterning followed by a fluorine-based plasma dry etch or wet etch or combination of thereof to exposing portions of the doped Group III-V layer 20. See U.S. Pat. No. 7,692,222 B2, atomic layer deposition in the formation of gate structures for III-V semiconductor, assigned to the same assignee as the present patent application, issued Apr. 6, 2010. Then, referring to FIG. 2F' a chlorine-based dry etch removes the doped Group III-V layer 20 and cap layer 19 (if present) to expose a portion of the barrier layer 18. It is noted that if Scandium Aluminum Nitride ($Sc_yAl_{1-y}N$) comprises a portion of cap layer 19 (if present) or barrier layer 18 that the chlorine-based dry etch can be made selective to the Scandium Aluminum Nitride ($Sc_{x,y}Al_{1-x,y}N$) portion of the cap layer or barrier layer if the chlorine-based etch is properly optimized. Finally, the dielectric layer 24 (FIG. 2G) is deposited by any suitable technique such as plasma enhanced chemical vapor deposition (PECVD), low pressure chemical vapor deposition (LPCVD), or sputtering over layer 22 and the exposed region of Group III-N barrier layer 18. It is noted that the dielectric layer 24 deposition process is optimized to allow enough leakage current, at the interface between layer 24 and exposed semiconductor surface in the GAP, to flow to the Gate electrode lower stem portion 15*a* and doped Group III-V layer 20 at the edge of the GAP, to minimize dispersion while not compromising transistor function through excessive gate leakage. Excessive gate leakage at the interface of gate electrode stem portion 15*a* and the exposed semiconductor at in the GAP would impair the current pinchoff (the on/off ratio) of the transistor. Optimizing the dielectric layer 24 deposition process may include pretreatment processes prior to dielectric deposition that impact surface parameters such as leakage and surface state defect levels. These pretreatment processes here for example include things such as high temperature annealing and wet chemical pretreatments, here for example, mixtures of ammonium hydroxide or hydrochloric acid or hydrofluoric acid, or nitric acid. Optimizing the dielectric layer 24 deposition process may also include optimizing the deposition parameters of the material (e.g. gas flow rates, gas composition, temperature, plasma power condition) in to tailor material characteristics (strain, stoichiometry, density, and hydrogen content) and interface properties such as surface state density and leakage.

More specifically, regarding the previously discussed impact of doped Group III-V layer 20, minimizing the width of opening 23 helps minimize dispersion (also known as current collapse) under large signal conditions caused by trapped charges in the high field portion of the gate to drain region. These trapped charges are located at the interface of barrier layer 18 and the passivating dielectric layer 24, and in the buffer layer 14*b* near the active region of device $10_1$ and lead to reduced current and therefore power output of a high frequency HEMT as trapped negative charges act as a parasitic gate that is negatively biased. Dispersion is expected to be minimized as the doped Group III-V layer 20 provides a shorter leakage path for the surface and buffer traps to discharge than would otherwise be provided by a leakage path to the drain electrode in the absence of a horizontal portion of doped Group III-V layer 20 that extends (as part of the epitaxial structure of device $10_1$) from the drain electrode 13 into the EXTRINSIC DRAIN REGION of device $10_1$ to the edge of the GAP that is located on the drain side of gate electrode 15. However, reducing the width of this opening, while minimizing current collapse, will also reduce the breakdown voltage of device $10_1$ as the lateral spreading of the high field depletion region on the drain side of the gate will likely become constrained by doped Group III-V layer 20 in EXTRINSIC DRAIN REGION at the edge of the GAP. As a result, the size of the opening must be optimized for a given application to maximize output power by achieving the optimal balance between dispersion and breakdown/operating voltage.

Figure 2H:
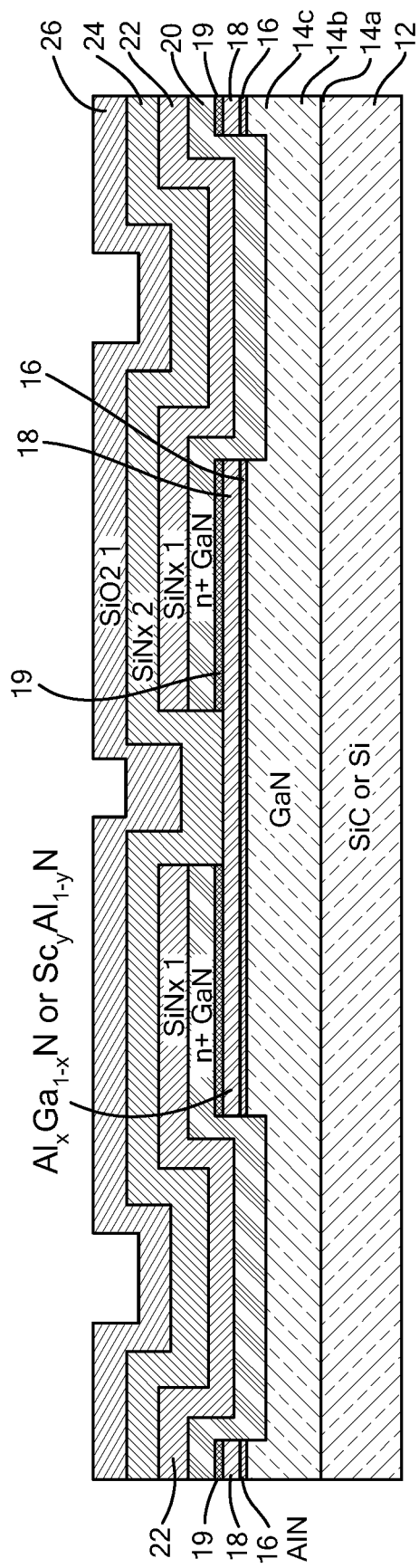

Referring now to FIG. 2H, the dielectric layer 26, here for example $SiO_2$, is deposited by any suitable technique such as plasma enhanced chemical vapor deposition (PECVD), low pressure chemical vapor deposition (LPCVD), or sputtering over layer 24. As dielectric layer 26 is a lower dielectric constant than layer 24 it serves to reduce the parasitic capacitance of the gate and therefore helps improve high-frequency performance. For applications where the gate length and horizontal upper portion of the electrode 15*a* can be suitably scaled, in order to reduce parasitic capacitance to meet performance objectives, dielectric layer 26 may be omitted.

Figure 2I:
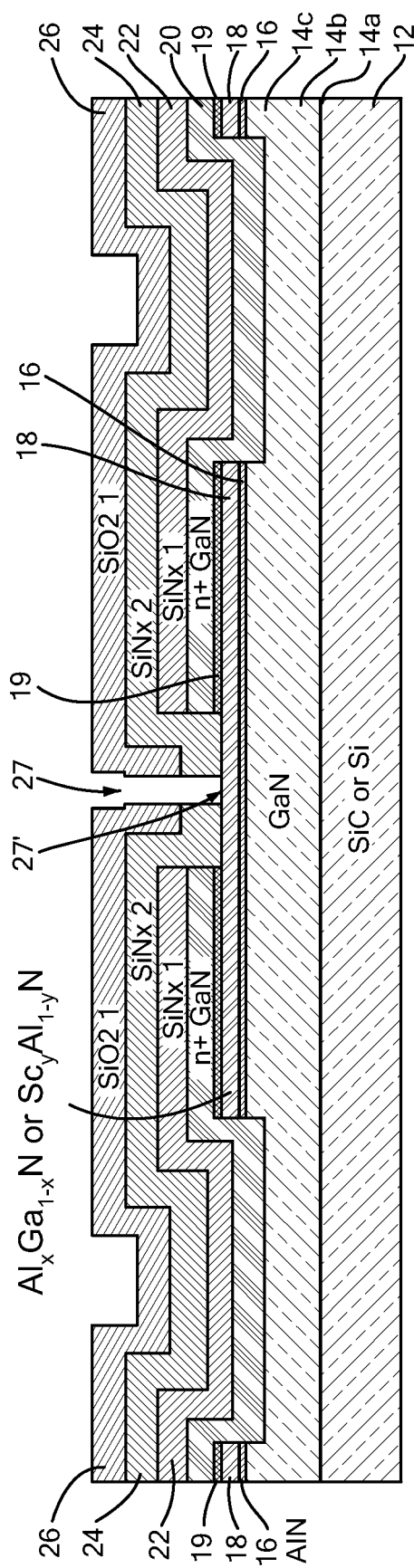

Referring now to FIG. 2I, an opening 27 is formed through portions of layers 26, 24, 22, 20, and 19, to expose channel region 27' of layer 18 where the gate electrode 15 (FIG. 1) is to be formed, as shown using lithographic-etching, (here, subtractive processing) here using a fluorine-based plasma dry etch. It is noted that a chlorine-based dry etch can be used to recess the exposed portion of the channel region 27' into the top portion of Group III-N barrier layer 18 after the formation of opening 27. This gate recess of resulting gate electrode 15 can be used to optimize device $10_1$'s pinchoff and transconductance characteristics for high frequency. It can also be used to minimize or eliminate short channel effects in short gate length device $10_1$ structure. Under some bias conditions, at a given recess etch depth into barrier layer 18, the recessed gate electrode 15 may also help reduce dispersion related to surface trapping as has been demonstrated in indium phosphide (InP) HEMTs as the high field portion of the drain edge of the gate disposed on channel region 27' is recessed away from surface traps at the interface between layers 24 and 18.

Figure 2J:
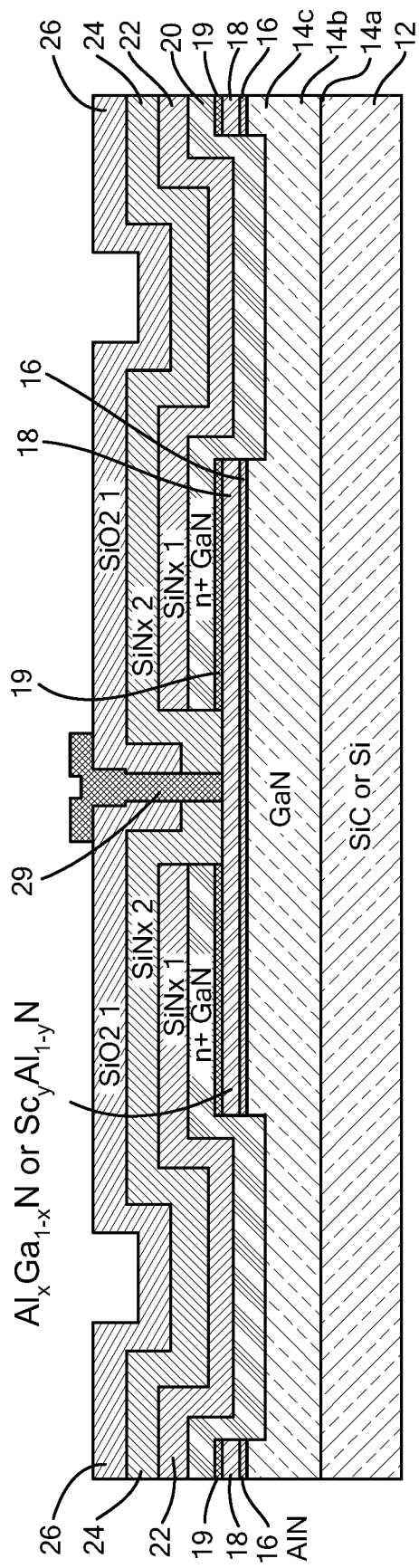

Referring to FIG. 2J, the lower stem portion 15*a* of gate electrode 15, here a T-gate, here for example comprised of TiN, W, TiN/W, Ni, Ta, TaN or a combination thereof, is formed as formed in Schottky contact with channel region 27' of layer 18, as shown. The gate electrode is deposited by any suitable technique such as sputtering (optimized for low damage) or atomic layer deposition (ALD). The electrode is then defined using a subtractive lithographic and etch process, here for example chlorine or fluorine-based plasma dry etch or combination thereof.

Figure 2K:
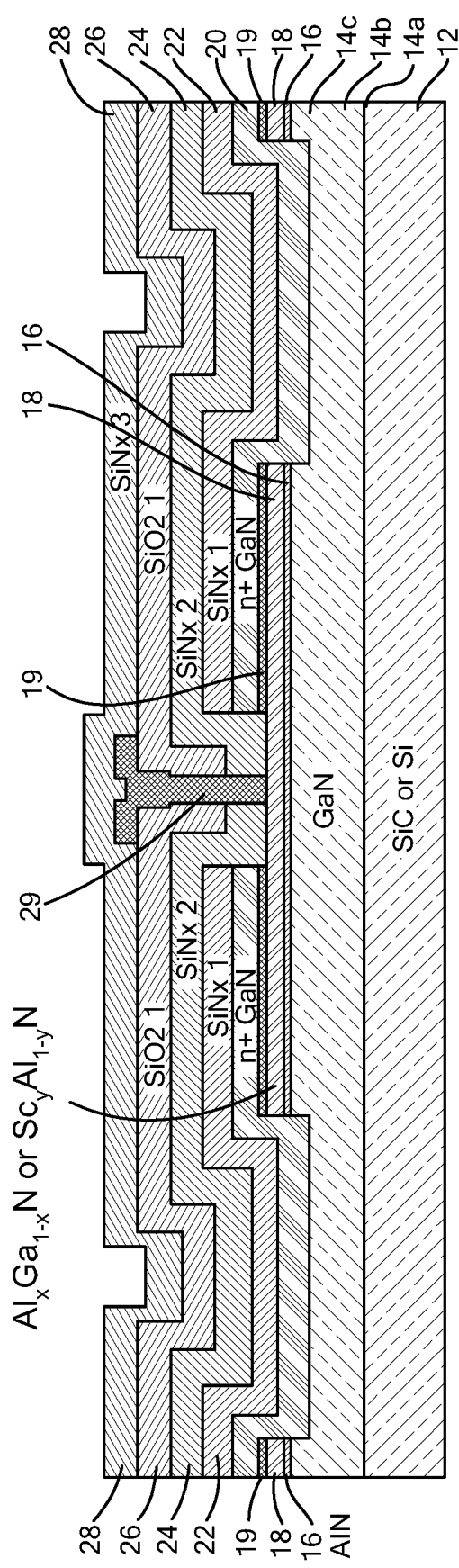

Referring now to FIG. 2K, the dielectric layer 28, here for example SiNx is formed over the structure, as shown. It is noted that in Damascene-based Cu back end of line (BEoL) processes that SiNx serves as a selective etch stop relative to the oxide trench, and when deposited above Cu, as a Cu diffusion barrier (in addition to being an etch stop).

Figure 2L:
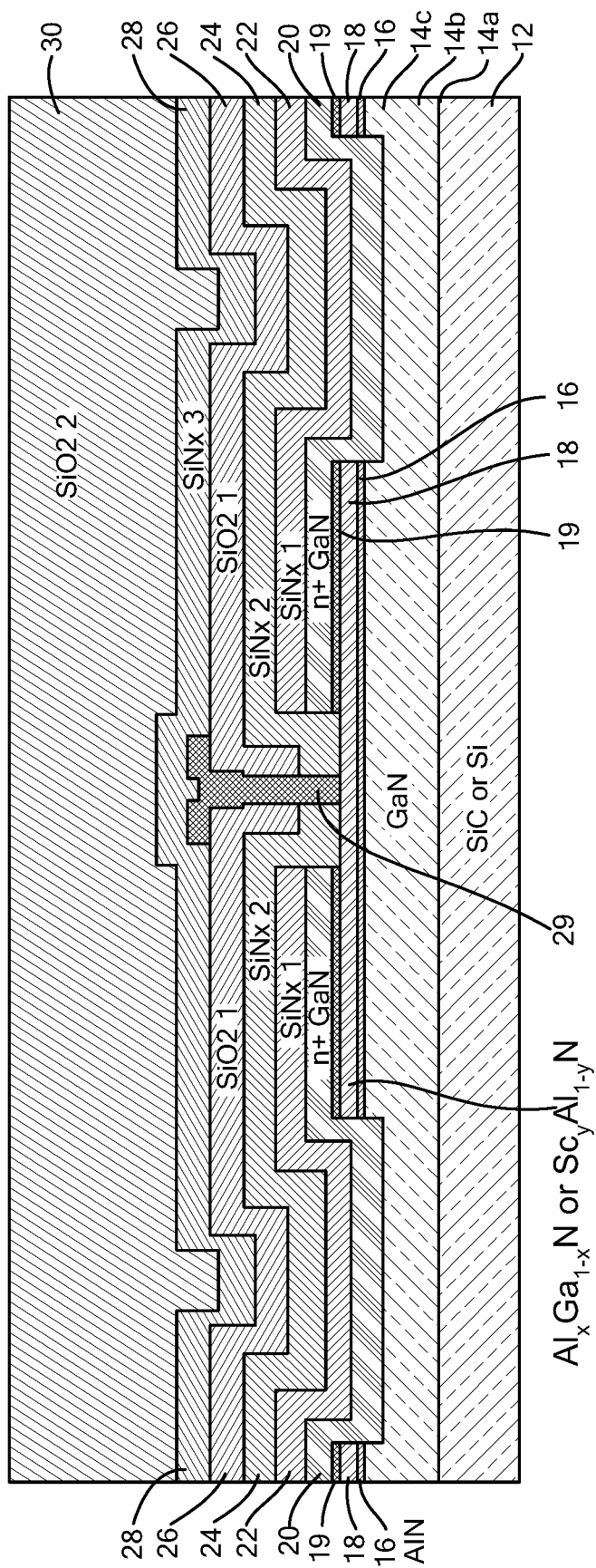

Referring now to FIG. 2L, the dielectric layer 30, here for example $SiO_2$, is formed over the structure, as shown.

Figure 2M:
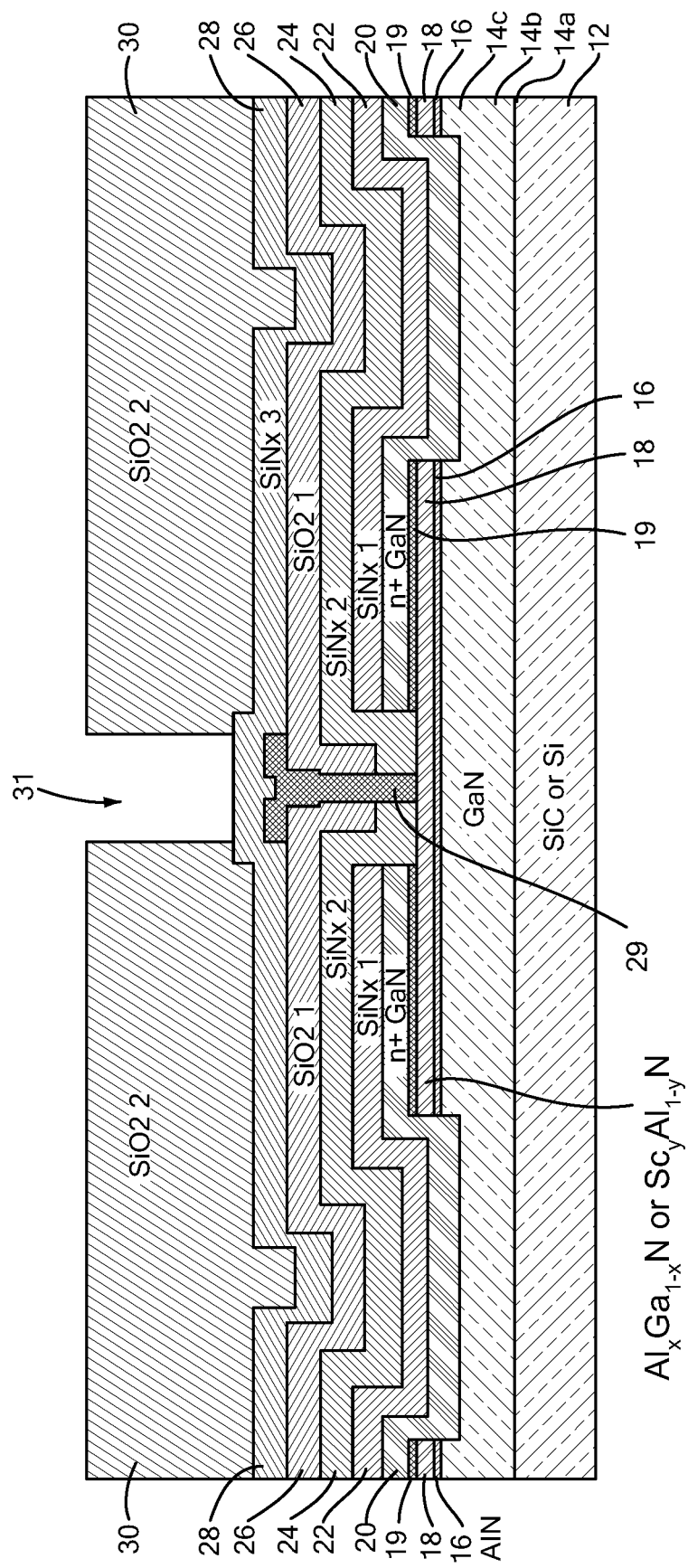

Referring now to FIG. 2M, an opening 31 is formed through layer 30 to expose a portion of dielectric layer 28 over the horizontal and stem portions gate electrode 15 using lithography-etching, (here, subtractive processing) here using a fluorine-based plasma dry etch, to selective stop on dielectric layer 28 as shown.

Figure 2N:
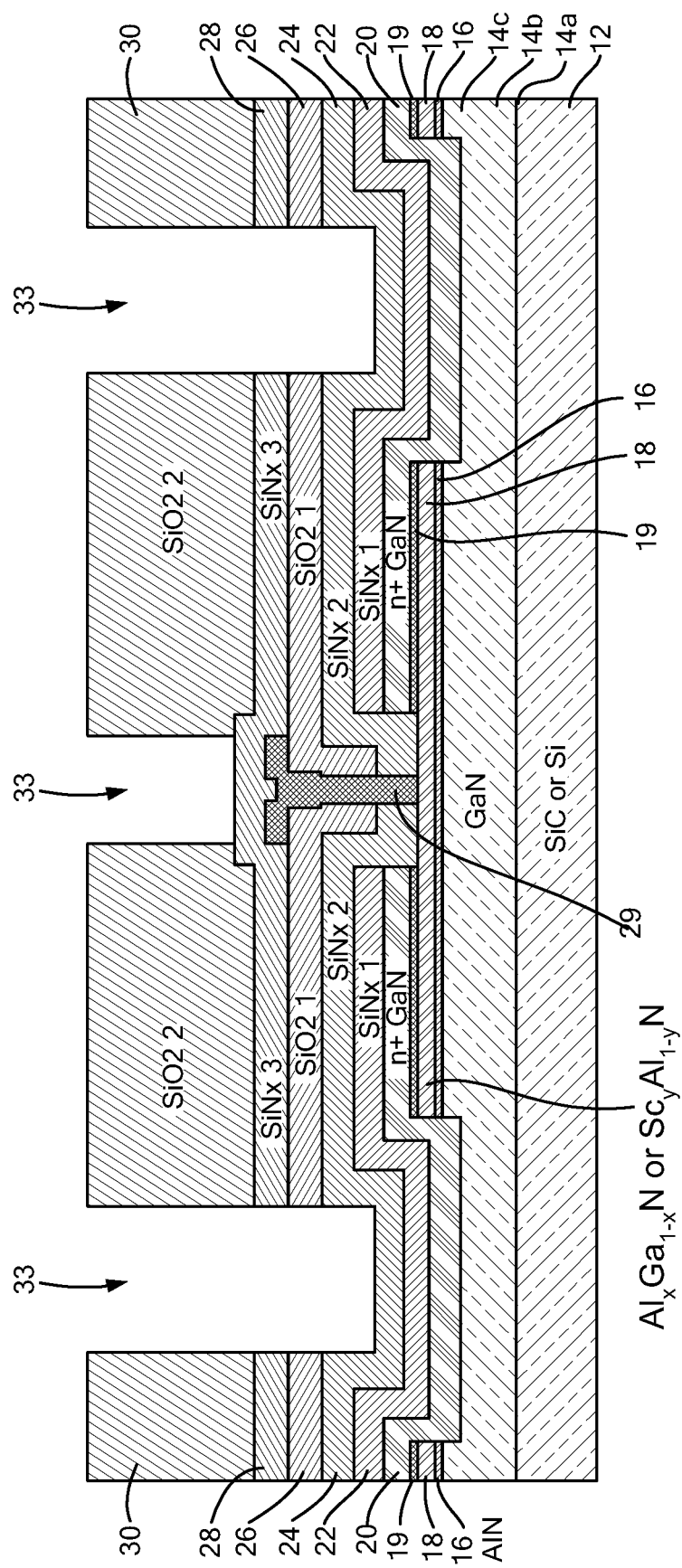
Figure 20:
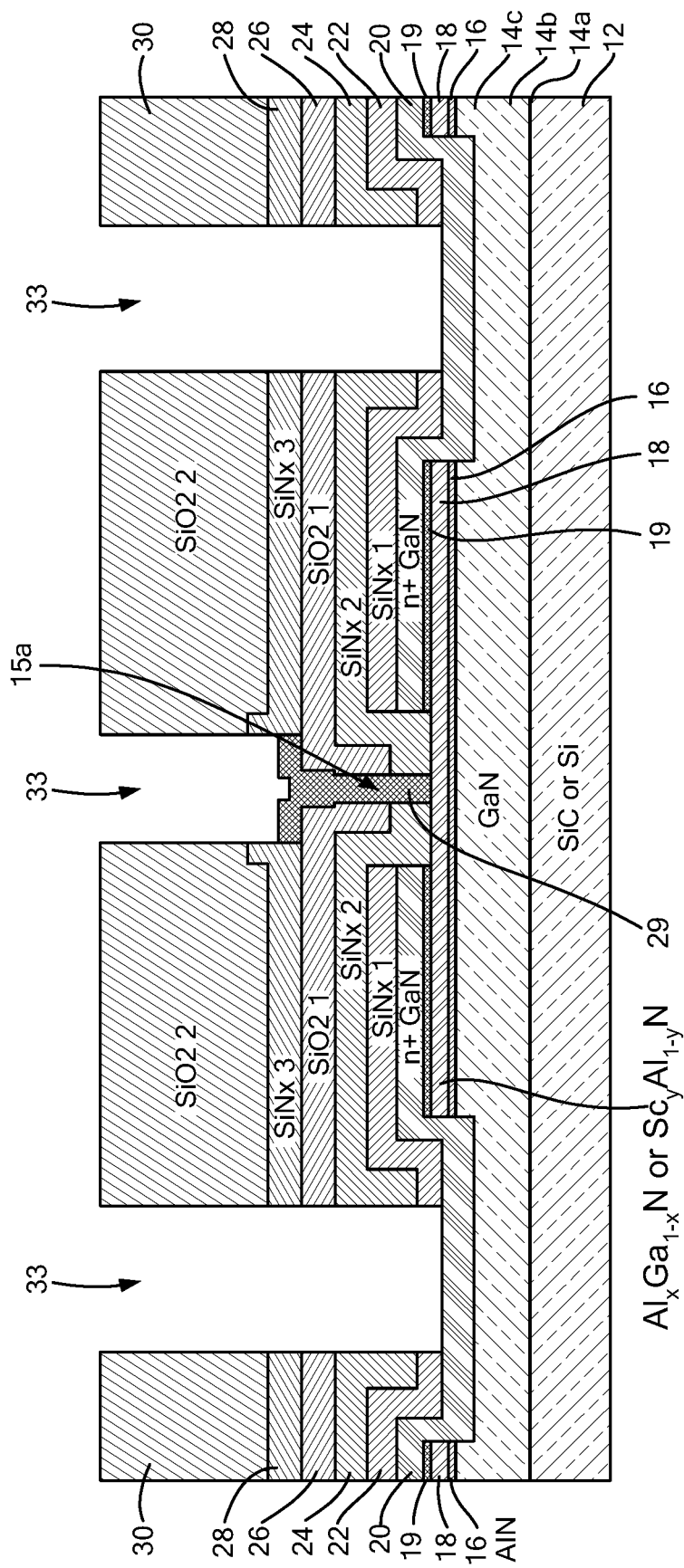

Referring now to FIG. 2N, openings 33' are formed through layers over the source and drain regions using lithography-etching, (here, subtractive processing) here using a fluorine-based plasma dry etch, to selective stop on dielectric layer 24 as shown.

Referring now to FIG. 2O, openings 33 are formed as shown using lithography—etching here using fluorine-based plasma dry etch stopping selectively on dielectric layer 24. Thus, as shown in FIG. 2O, the resist, not shown, used in the lithographic-etching subtractive process) is removed and dielectric layers 24 and 22 (over the source and drain regions of the doped Group III-V layer 20) and dielectric layer 28 (over gate electrode 15) are simultaneously, here for example using a fluorine-based plasma dry etch, removed in openings 33 (source and drain) and 31 (gate) respectively to expose portions of doped Group III-V layer 20 where the source and drain electrodes 11, 13, are to be formed and to expose the top of the stem portion 15*a* of the gate electrode 15, as shown. It is noted that if the gate stem is not completely filled with gate stem metal that etch removes dielectric material that has been deposited into the stem and thereby forms a void in the gate stem metal that will be later filled by the Cu Damascene BEoL electrode structure.

Figure 2P:
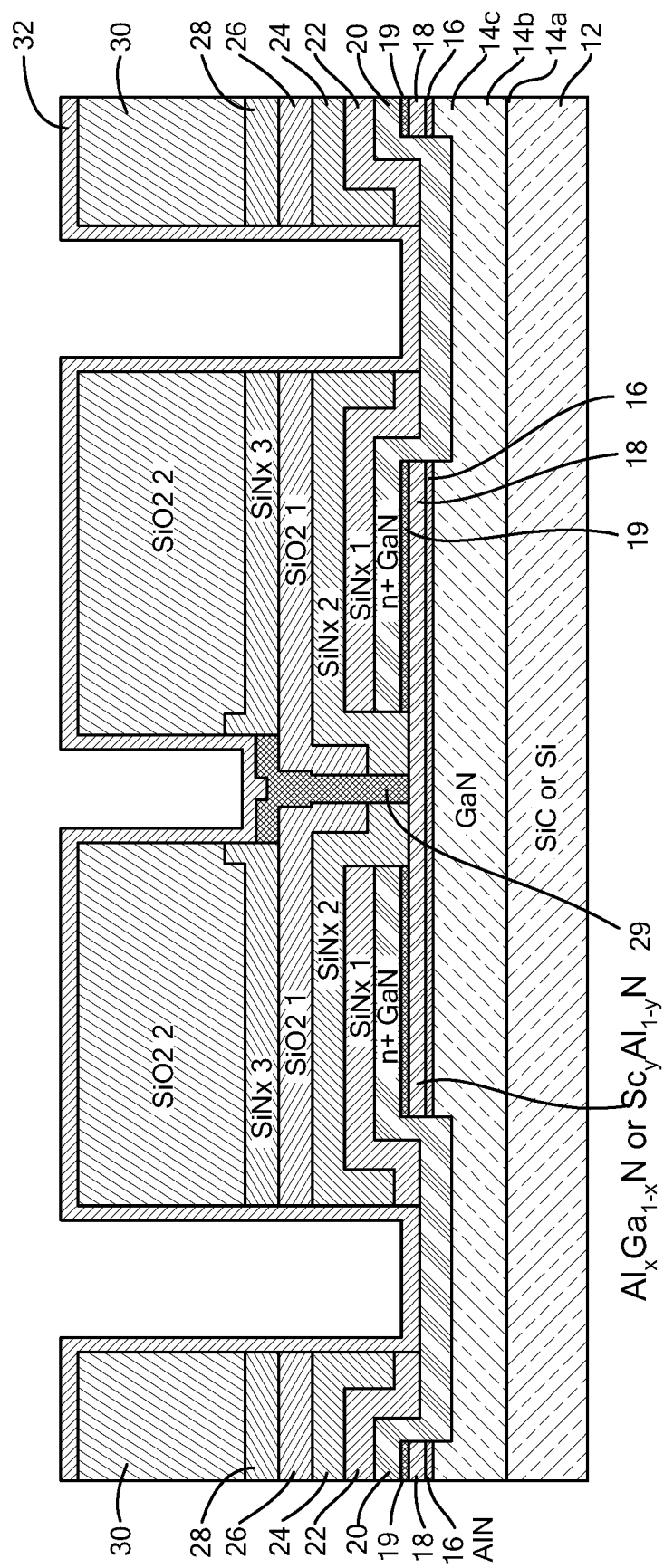

Referring now to FIG. 2P, the adhesion and barrier layer 32 is deposed on the walls of the openings 33 and 31, as shown. As discussed previously it is noted that the adhesion and barrier layer 32 comprises TiN, Ta, Ta/Cu or Ta/TaN/Cu or TaN/Cu or TiN/Cu, or other combination of these metals. It is noted that TiN, Ta, TaN, Ta/TaN or other combination of these materials, serve as both adhesion layers and Cu diffusion barrier materials. When Cu damascene is used for Cu fill layer 34, adhesion and barrier layer 32 also serves as a seed layer for plating, here for example using Ta/Cu, Ta/TaN/Cu, TiN/Cu other such stack terminating in Cu comprising adhesion and barrier layer 32.

Figure 2Q:
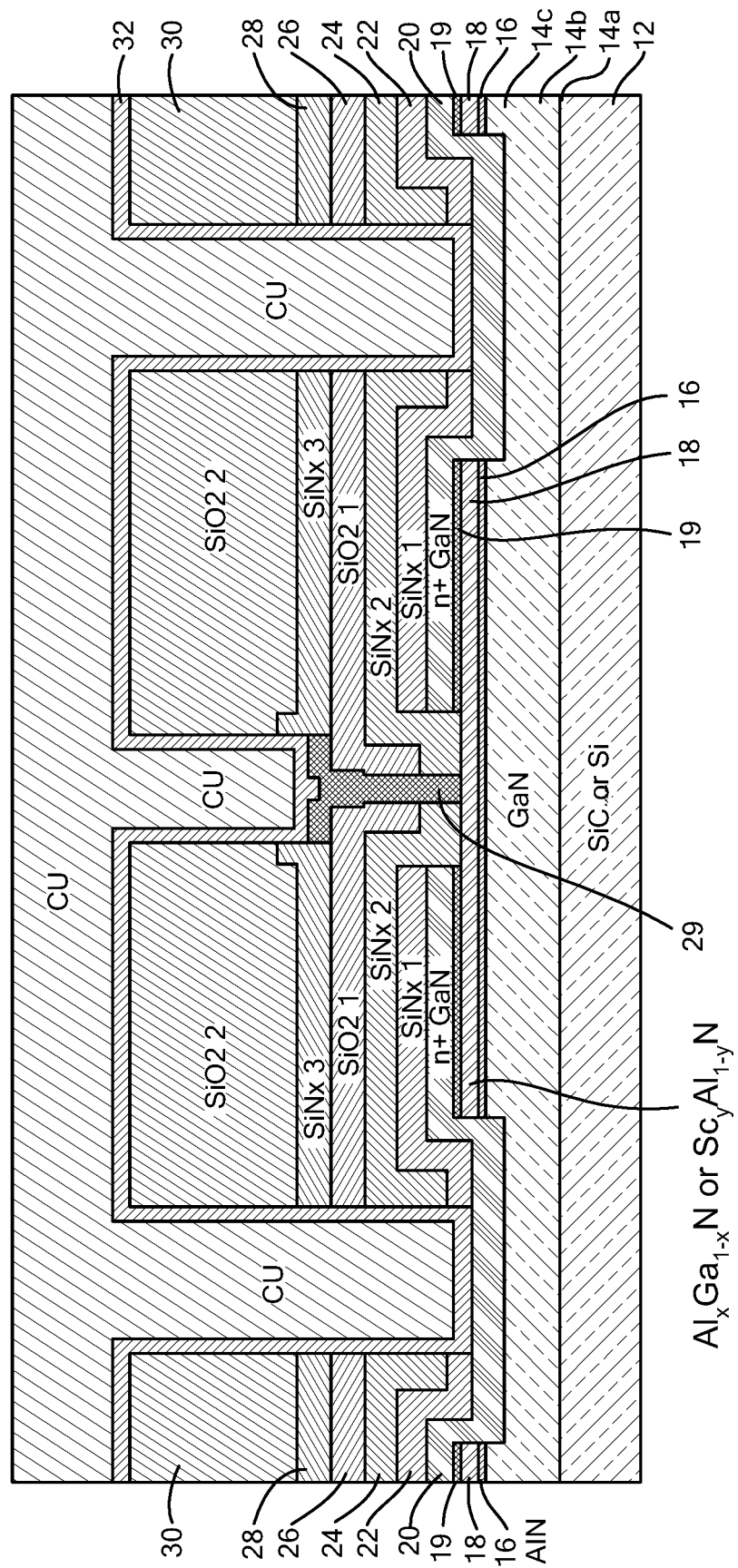

Referring now to FIG. 2Q, the Cu fill layer 34 is formed over the adhesion and barrier layer 32, here for example by plating as shown. After planarizing the layer 34 using chemical mechanical polishing (CMP) resulting in the structure 10, shown in FIG. 1.

It should be noted that the process described in connection with FIGS. 2A-2Q uses silicon-like subtractive processing. Silicon-like subtractive processes are processes, similar to those used in silicon CMOS foundries, that remove excess or unwanted material by masking and etch processes or CMP processes that take place after the material is blanket deposited onto the wafer. Further, the process uses a $SiO_2$ sacrificial layer 21 and removes that $SiO_2$ layer post ohmic recess. As the wafer does not have dielectric on the surface during doped Group III-V layer 20 formation, it does not require a specialized opening formed in a dielectric in order to perform in-situ growth monitoring techniques, here for example reflection high-energy electron diffraction (RHEED), that are employed in MBE growth. As noted above, the monitoring is performed outside device $10_1$; that is, it is performed in the larger area field region 9.

It should be understood, and referring to FIG. 1', that SiN layer 22 in FIG. 1 may be eliminated by using a photoresist layer in FIG. 2F in place of layer 22 with the window 23 to thereby remove by etching the window 23 exposed portion of the doped Group III-V layer 20. The photoresist mask would then be removed and then SiN layer 24 deposited with the process continuing as described above.

Figure 3:
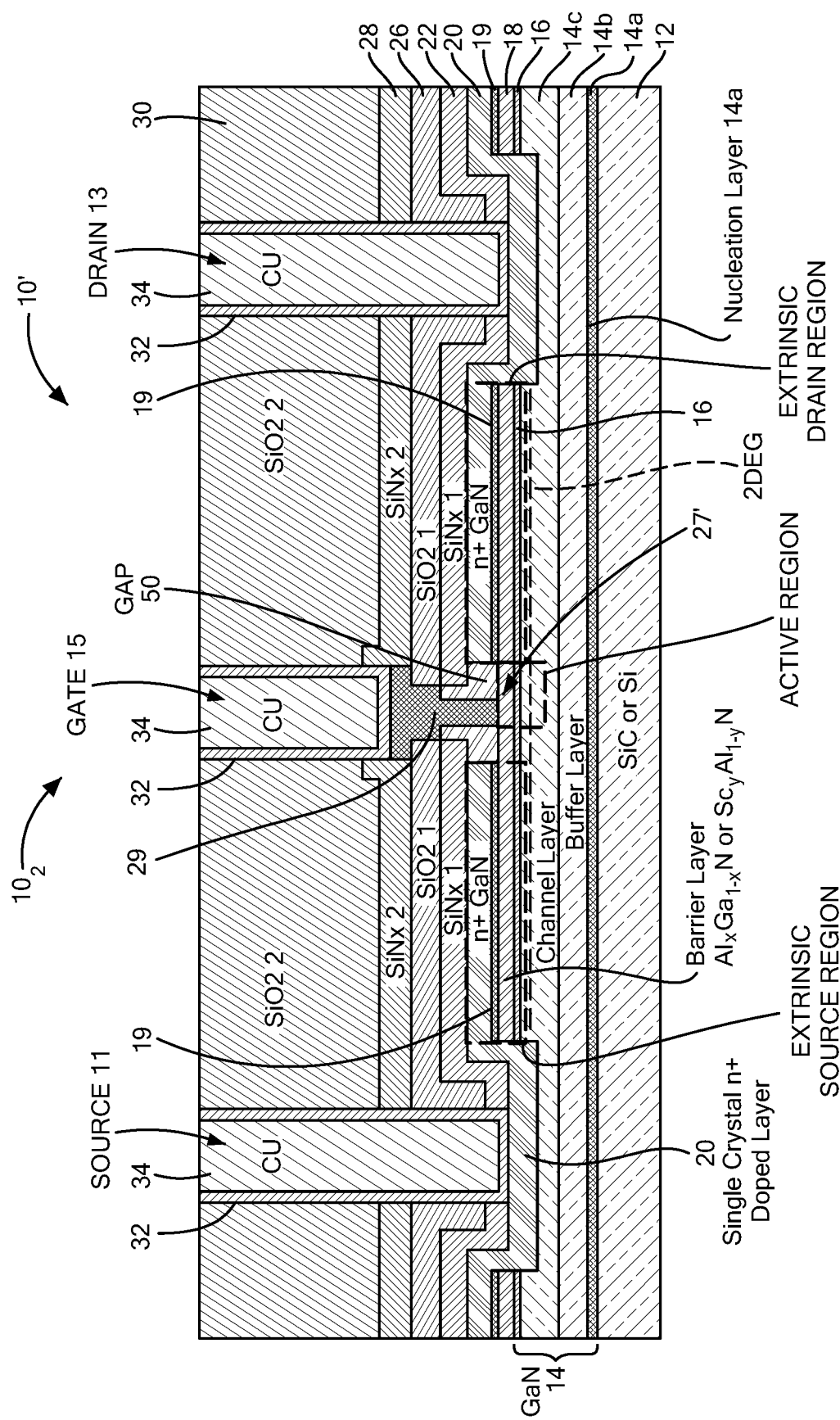
FIG. 3 is a simplified, diagrammatical sketch of a Field Effect Transistor (FET) according to another embodiment of the disclosure.
Figure 4A:
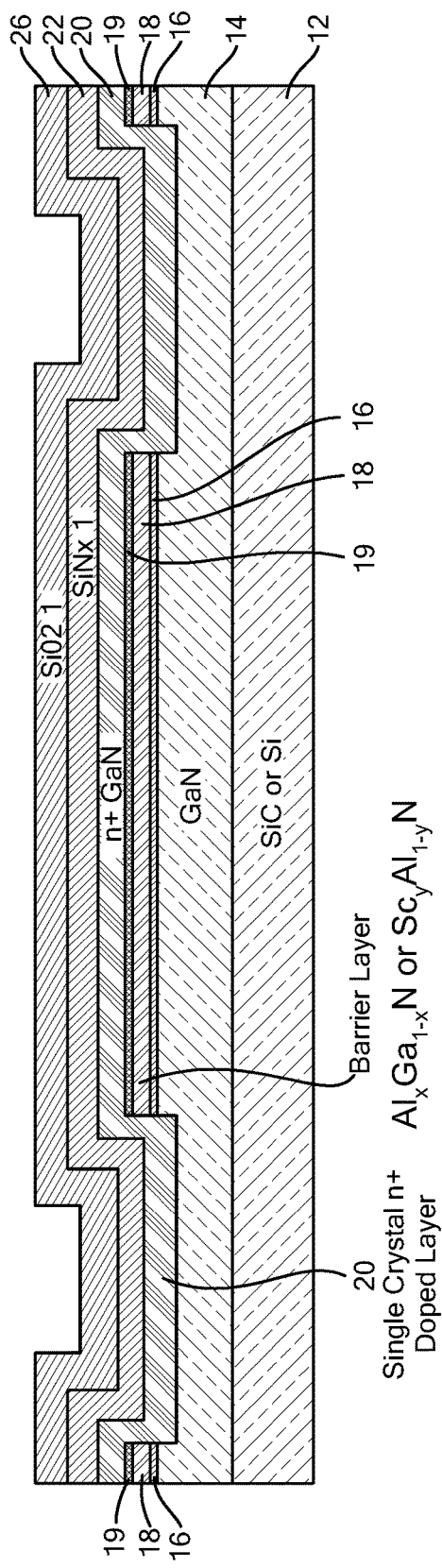
FIGS. 4A-4H are simplified, diagrammatical sketches of the Field Effect Transistor (FET) of FIG. 3 at various stages in the fabrication thereof according to the disclosure.

Referring now to FIG. 3, another embodiment of a semiconductor structure, 10' processed using silicon-like subtractive processing techniques, is shown. Here, semiconductor structure 10' includes dielectric spacer dielectric material, 50, here for example $Al_2O_3$ or SiNx, deposited by any suitable method such as PECVD, LPCVD, Sputtering, or Atomic Layer Deposited (ALD), formed in a manner to be described below. After forming the structure shown in FIG. 2F by the process described above in connection with FIGS. 2A-2E, dielectric layer 26, here for example $SiO_2$, is deposited over the surface as shown in FIG. 4A. As layer 26 is a lower dielectric constant than layer 22 it serves to reduce the parasitic capacitance of the gate and therefor helps improve high-frequency performance. For applications where the gate length and horizontal upper portion of the electrode 15a can be suitably scaled, in order to reduce parasitic capacitance to meet performance objectives, dielectric layer 26 may be omitted.

Figure 4B:
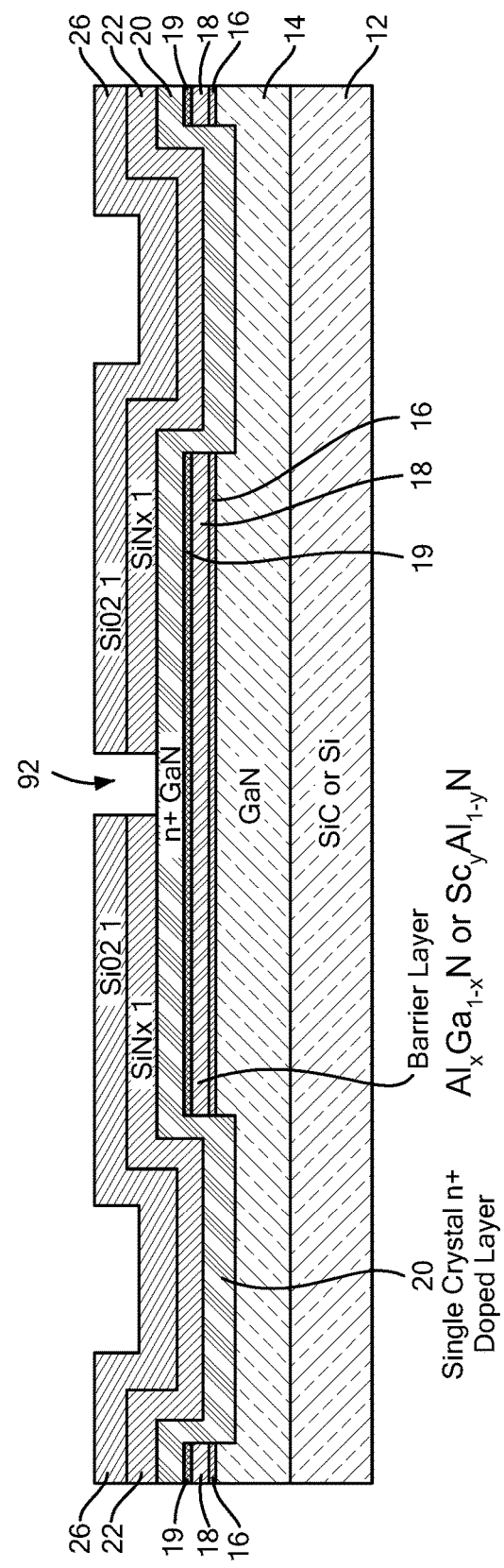

Referring to FIG. 4B, an opening 92 is formed through layers 26 and 22, here for example using a fluorine-based plasma dry etch, to expose portion of the doped Group III-V layer 20 where the gate electrode 15 is to be formed.

Figure 4C:
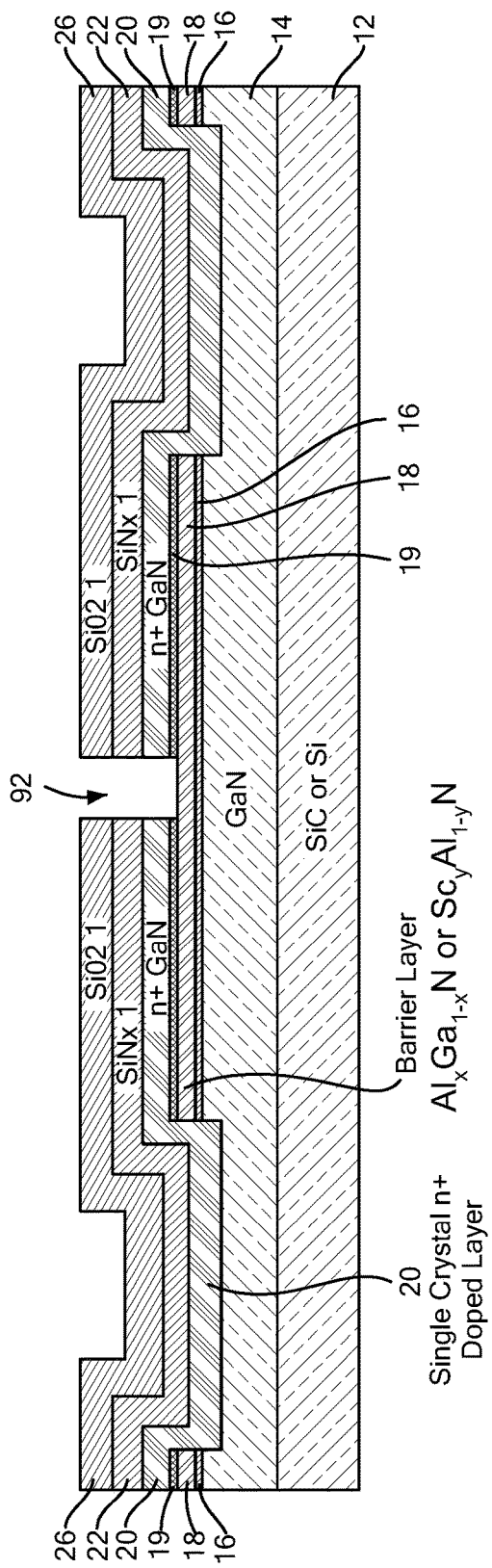

Referring now to FIG. 4C, portions of the doped Group III-V layer 20 exposed by the opening 92 are dry etched using a chlorine-based plasma to expose portions to the barrier layer 18, as shown.

Figure 4D:
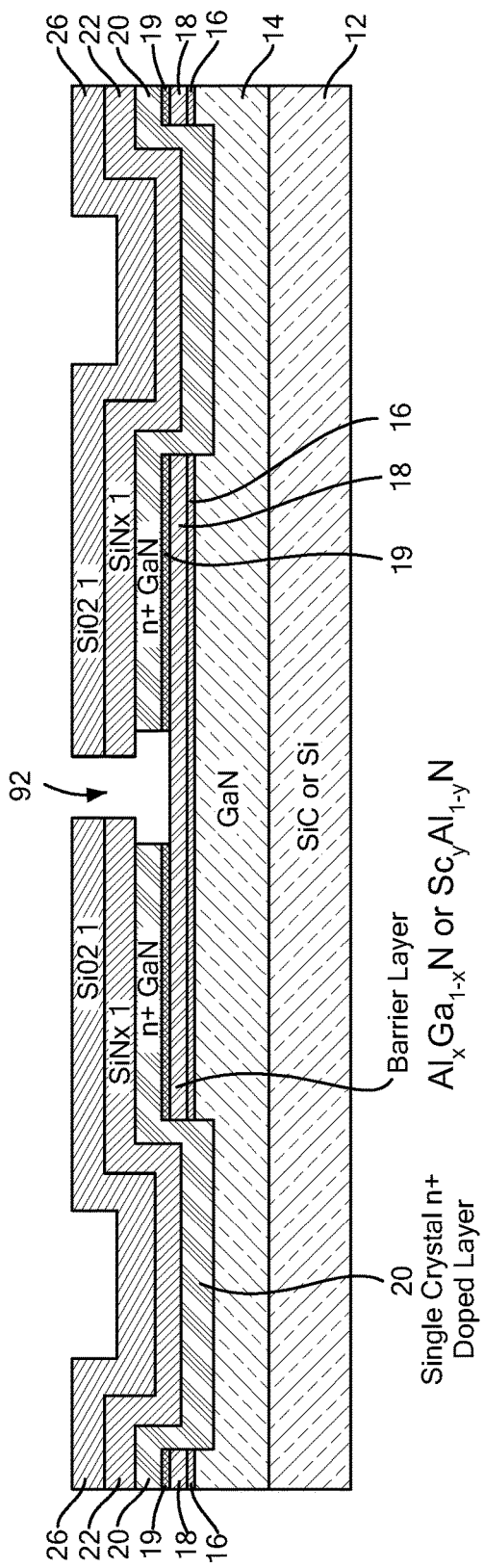

Referring now to FIG. 4D, the structure is dry etched by a chlorine-based dry etch to the remove doped Group III-V layer 20 and expose cap layer 19 (if present) or barrier layer 18. It is noted that if Scandium Aluminum Nitride ($Sc_yAl_{1-y}N$) comprises a portion of cap layer 19 (if present) or barrier layer 18 that the chlorine-based dry etch can be made selective to the Scandium Aluminum Nitride ($Sc_yAl_{1-y}N$) portion of the barrier layer. Additionally, by using a suitably selective and low power chlorine-based dry etch, an over etch can be employed that laterally etches any III-N layers above the Nitride ($Sc_yAl_{1-y}N$) portion of the barrier layer. As shown in FIG. 4D the doped Group III-V layer 20 and cap layer 19 are laterally etched. The result is ultimately a gate that is self-aligned in the opening 92. Minimizing the width of opening 92 helps minimize dispersion (also known as current collapse) under large signal conditions caused by trapped charges in the high field portion of the gate to drain region. These trapped charges are located at the interface of barrier layer 18 and dielectric layer 50 and in the buffer layer 14b near the active region of the device $10_2$ and lead to reduced current and therefore power output of a high frequency HEMT as trapped negative charges act as a parasitic gate that is negatively biased. Dispersion is expected to be minimized as the doped Group III-V layer 20 provides a shorter leakage path for the surface and buffer traps to discharge than would otherwise be provided by a leakage path to the drain electrode in the absence of a horizontal portion of the doped Group III-V layer 20 that extends (as part of the epitaxial structure of device $10_2$) from the drain electrode 13 into the EXTRINSIC DRAIN REGION of device $10_2$ to the edge of the GAP that is located on the drain side of gate electrode 15. However, reducing the width of the GAP (opening 92), while minimizing current collapse, will also reduce the breakdown voltage of device $10_2$ as the lateral spreading of the high field depletion region on the drain side of the gate will likely become constrained by doped Group III-V layer 20 in EXTRINSIC DRAIN REGION at the edge of opening 92. As a result, the size of the opening 92 must be optimized for a given application to maximize output power by achieving the optimal balance between dispersion and breakdown/operating voltage. It should be noted that performance could be enhanced further by recessing the gate electrode 15 into the upper portion of Scandium Aluminum Nitride ($Sc_yAl_{1-y}N$) barrier layer 18 by using a less selective chlorine-based dry etch, to recess the gate before switching over to the more selective dry etch to laterally etch opening 92. As mentioned previously, this gate recess of resulting gate electrode 15 can be used to optimize device $10_2$ pinchoff, and transconductance characteristics for high frequency. It can also be used to minimize or eliminate short channel effects in short gate length device $10_2$ structures. Under some bias conditions, at a given recess etch depth into barrier layer 18, the recessed gate electrode 15 may also help reduce dispersion related to surface trapping as has been demonstrated in InP HEMTs.

Figure 4E:
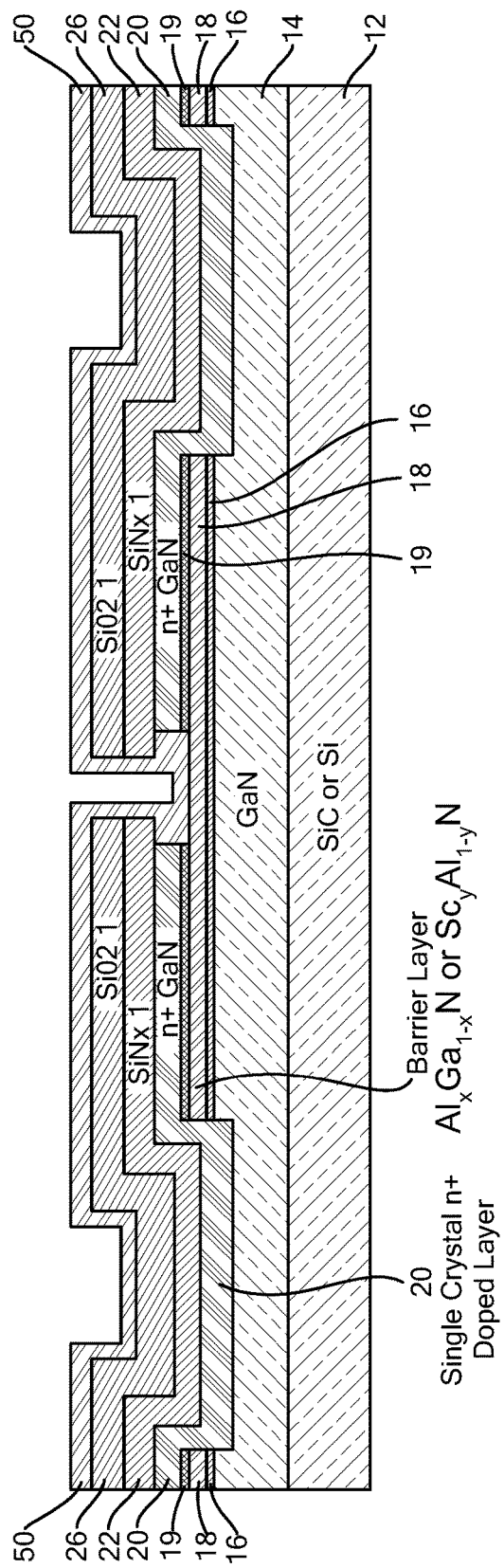

Referring now to FIG. 4E, dielectric layer 50, here for example $Al_2O_3$ or $SiN_x$, is deposited to form the structure shown in FIG. 4E. In a manner similar to the optimization of dielectric layer 24 deposition, the dielectric deposition process of dielectric layer 50 is optimized to allow enough leakage current, at the interface between layer 50 and the exposed semiconductor surface in the GAP, to flow to the Gate electrode lower stem portion 15a and doped Group III-V layer 20 at the edge of the GAP, to minimize dispersion while not compromising transistor function through excessive gate leakage.

Figure 4F:
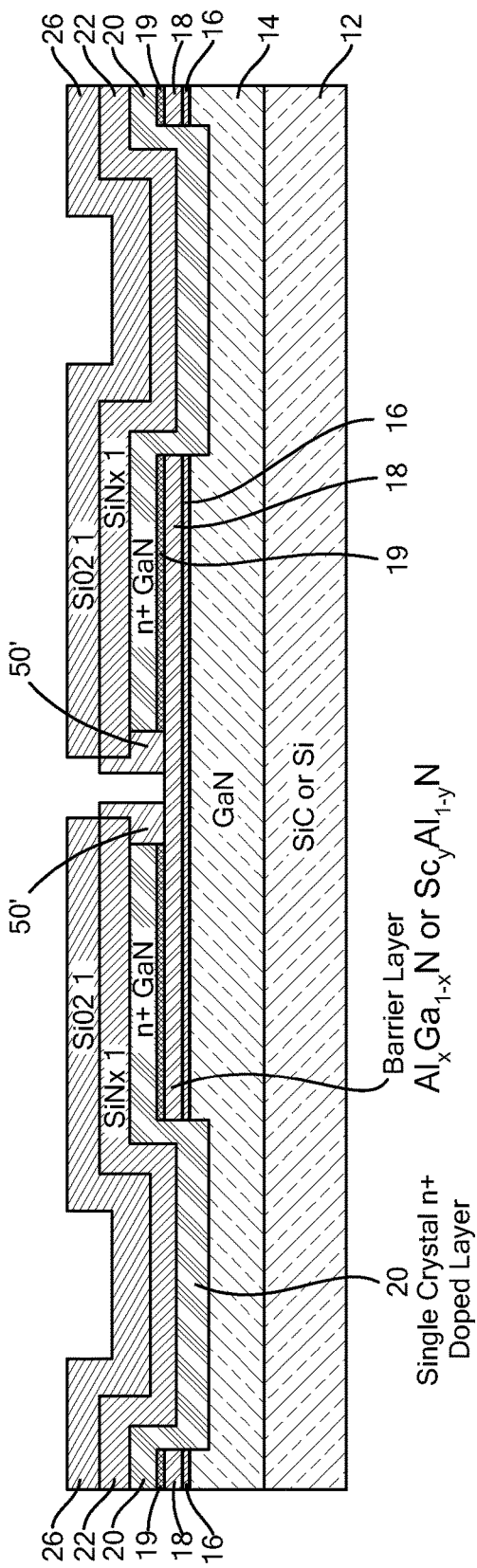

Referring now to FIG. 4F, dielectric layer 50 etched back to form gate spacer layer 50' in opening 92 to define the gate contact area. Spacer layer 50' deposition is optimized so that the desired width and height of the spacer layer 50' is optimized for gate width and profile formation. Spacer layer 50' height post etch may be coincident with the top of dielectric layer 26 or recessed to any point within opening 92. This technique can be used to further reduce gate length and thereby improve the high frequency performance of the transistor and shape the field profile of the gate, thereby improving breakdown voltage, by creating an additional horizontal portion of the gate.

Figure 4G:
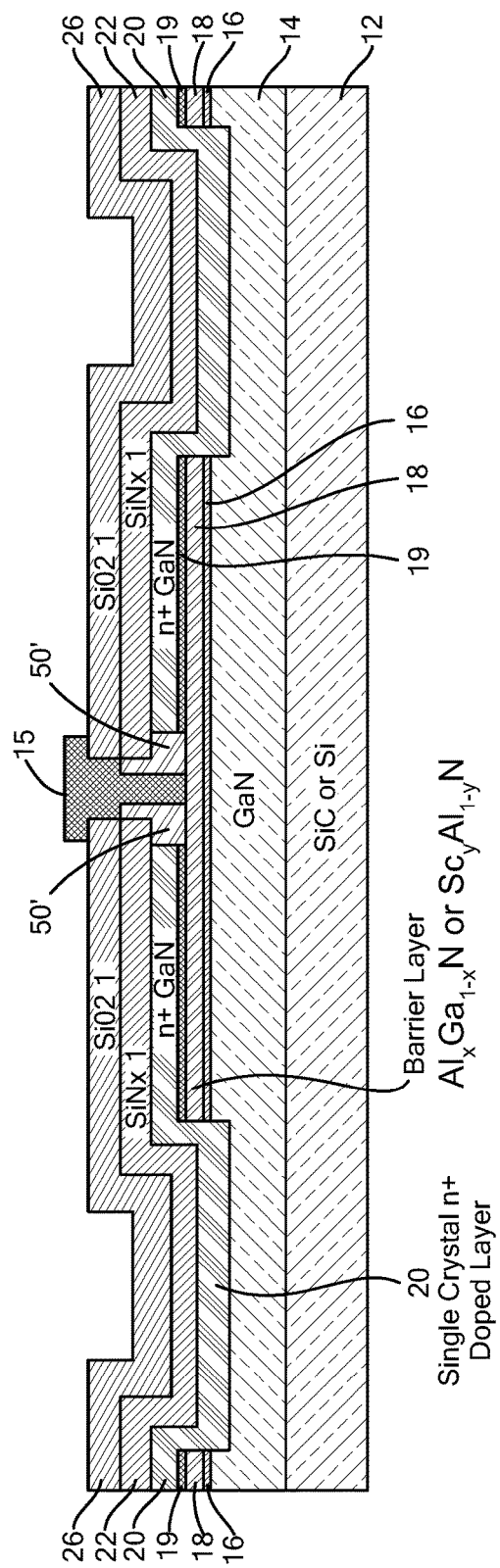

Referring now to FIG. 4G, the gate electrode 15 is formed in Schottky contact with the barrier layer 18, as shown. Here for example, gate electrode 15 is a T-gate comprised of TiN, W, TiN/W, Ni, Ta, TaN or a combination thereof. The gate electrode is deposited by any suitable technique such as sputtering (optimized for low damage) or atomic layer deposition (ALD). The electrode is then defined using a subtractive lithographic and etch process, here for example chlorine or fluorine-based plasma dry etch or combination thereof.

Figure 4H:
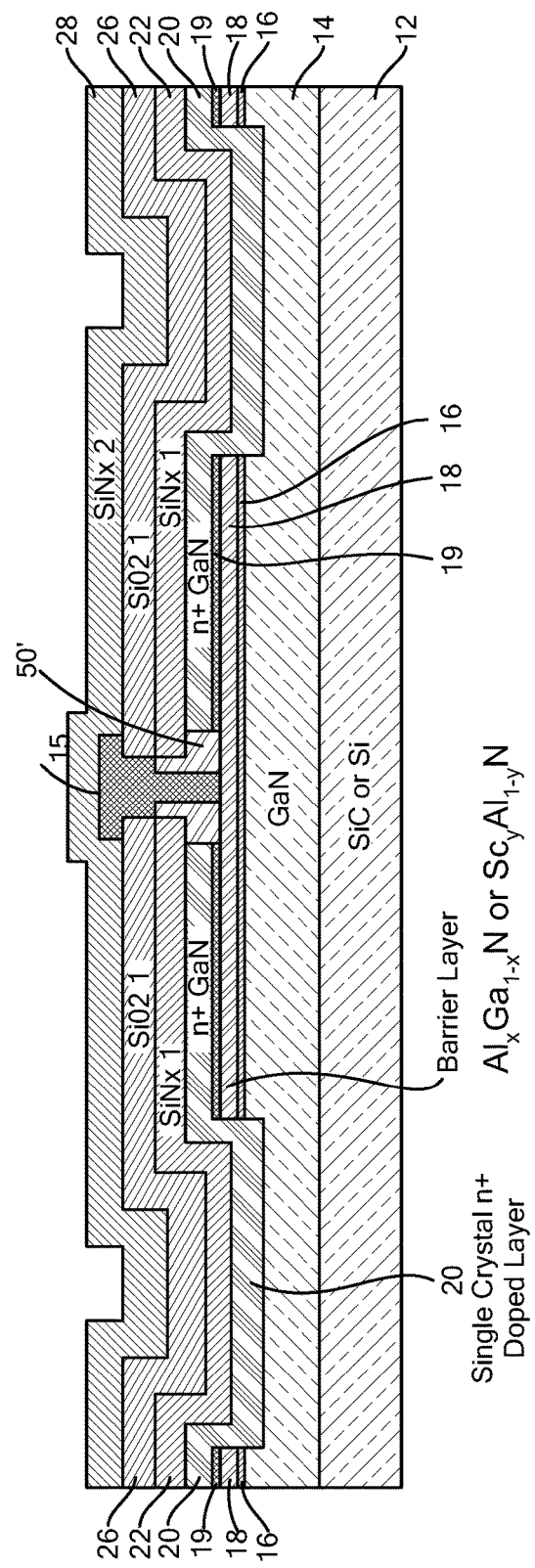

Referring now to FIG. 4H the dielectric layer 24, here for example SiNx is formed over the structure, by any suitable technique such as plasma enhanced chemical vapor deposition (PECVD), low pressure chemical vapor deposition (LPCVD), The process continues as described above in connection with FIGS. 2L-2Q.

Figure 5:
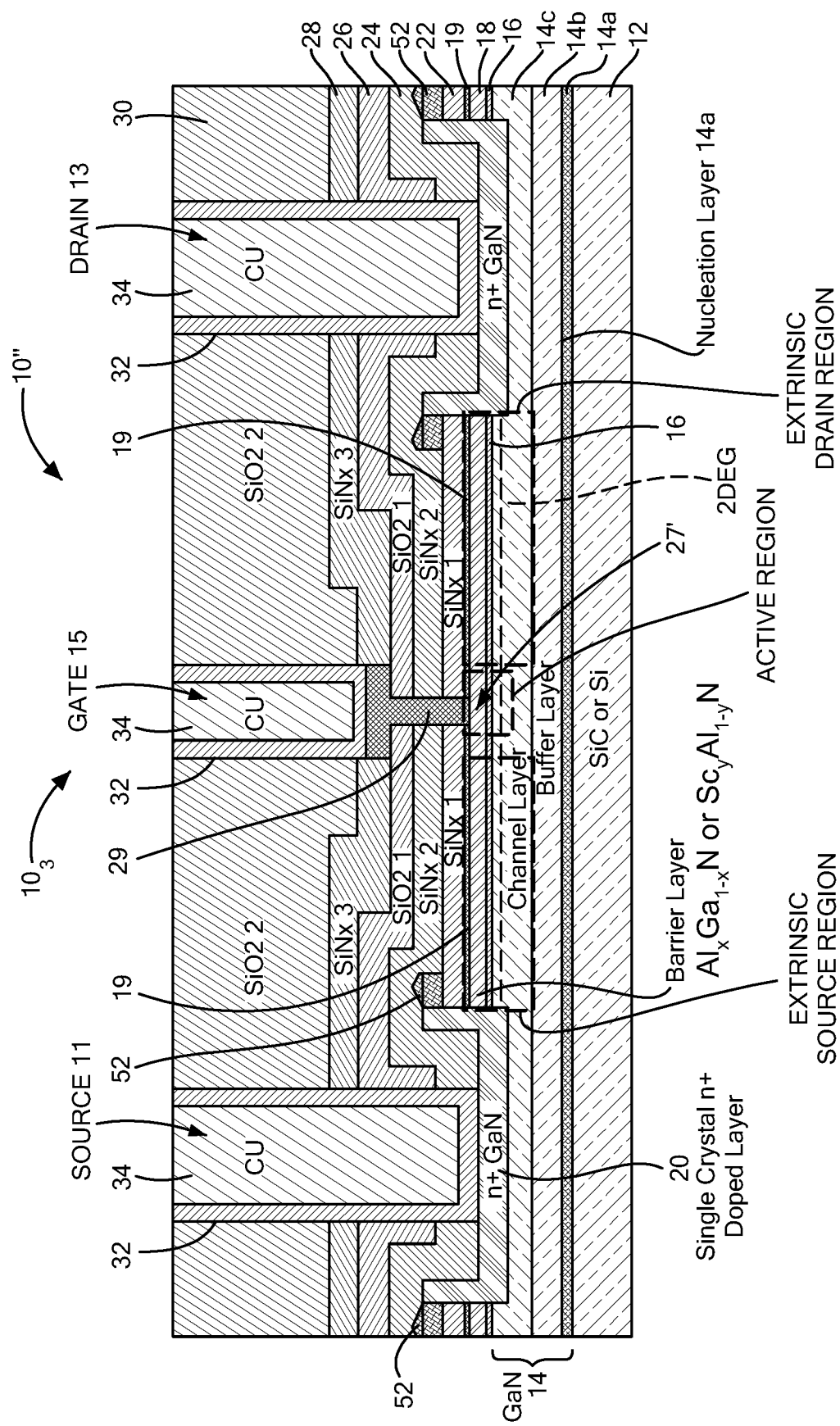
FIG. 5 is a simplified, diagrammatical sketch of a Field Effect Transistor (FET) according to another embodiment of the disclosure.

Referring now to FIG. 5, another structure 10'', processed using silicon-like subtractive processing techniques, is shown. Here the barrier layer 19 is either $Al_xGa_{1-x}N$ or $Sc_yAl_{1-y}N$. Also, here the gate electrode is in Schottky contact with layer 18 or 19, as shown. Still further it is noted that there are regions that have polycrystalline n+ GaN layer 52, for reasons to be described below in connection with the process used to form the structure 10''.

Figure 6A:
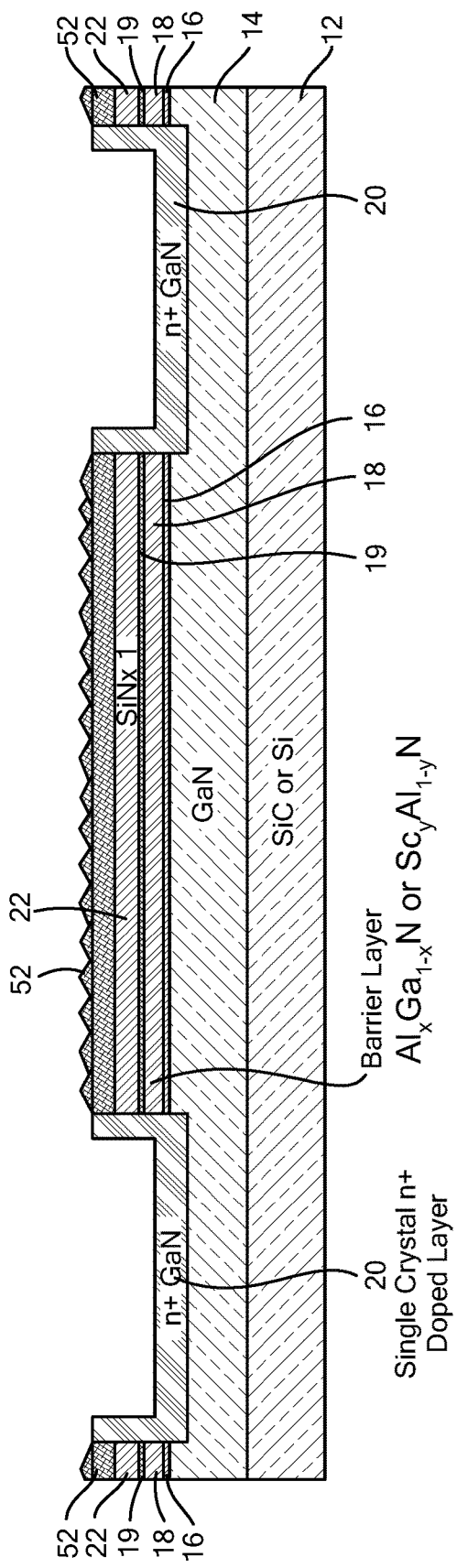
FIGS. 6A-6I are simplified, diagrammatical sketches of the Field Effect Transistor (FET) of FIG. 5 at various stages in the fabrication thereof according to the disclosure.

Referring now to FIG. 6A, unlike previous embodiments, instead of using a dielectric layer 21 of $SiO_2$ as in FIG. 2A, a dielectric layer 22 of $SiN_x$ is in deposited in direct contact with the barrier layer 19. It is noted that the dielectric layer 22 may be considered later in the process as a non-sacrificial mask and serves as a passivation layer for the device. It is also noted that in the previous embodiments we want to remove the hard mask (layer 21) and being SiO2 it is easier to remove with a wet etch than the SiNx Layer 22. Here, in this embodiment, we want to use the SiNx layer 22 as a passivation layer as well as a hard mask and SiNx is a better passivation than SiO2 for GaN.

The process then continues using a lithographic-etching process and a mask configured as shown for mask 45 in FIGS. 2B and 2C as described above in connection with FIGS. 2B, 2C, 2C' albeit with layer 22 in place of layer 21 to form the source recess 29S and drain recess 29D as shown in FIG. 6A. It is noted that the mask may be formed to also expose portions of layer 22 outside of the device region. The n+regrowth doped Group III-V layer 20 is formed after the formation of the source and drain recesses 29S, 29D, as shown. The portion of the n+ epitaxial material that is deposited on the $SiN_x$ layer 22 forms polycrystalline n+ GaN layer 52. The portion of the n+ epitaxial material that is deposited onto the exposed source and drain recessed regions 29S, 29D onto the exposed portions of GaN layer 14 form the single crystal doped Group III-V layer 20.

Figure 6B:
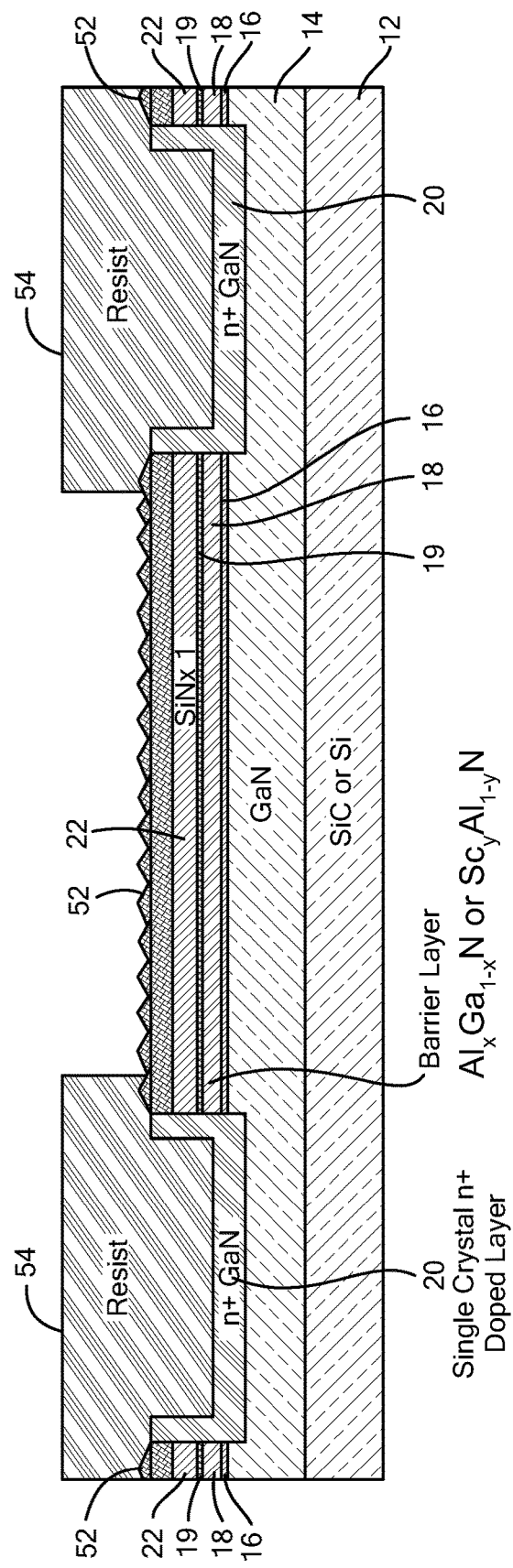

Referring to FIG. 6B, a resist mask 54 is formed over the structure with a window exposing portions of the polycrystalline layer 52 between the source and drain recessed regions 29S, 29D, as shown.

Figure 6C:
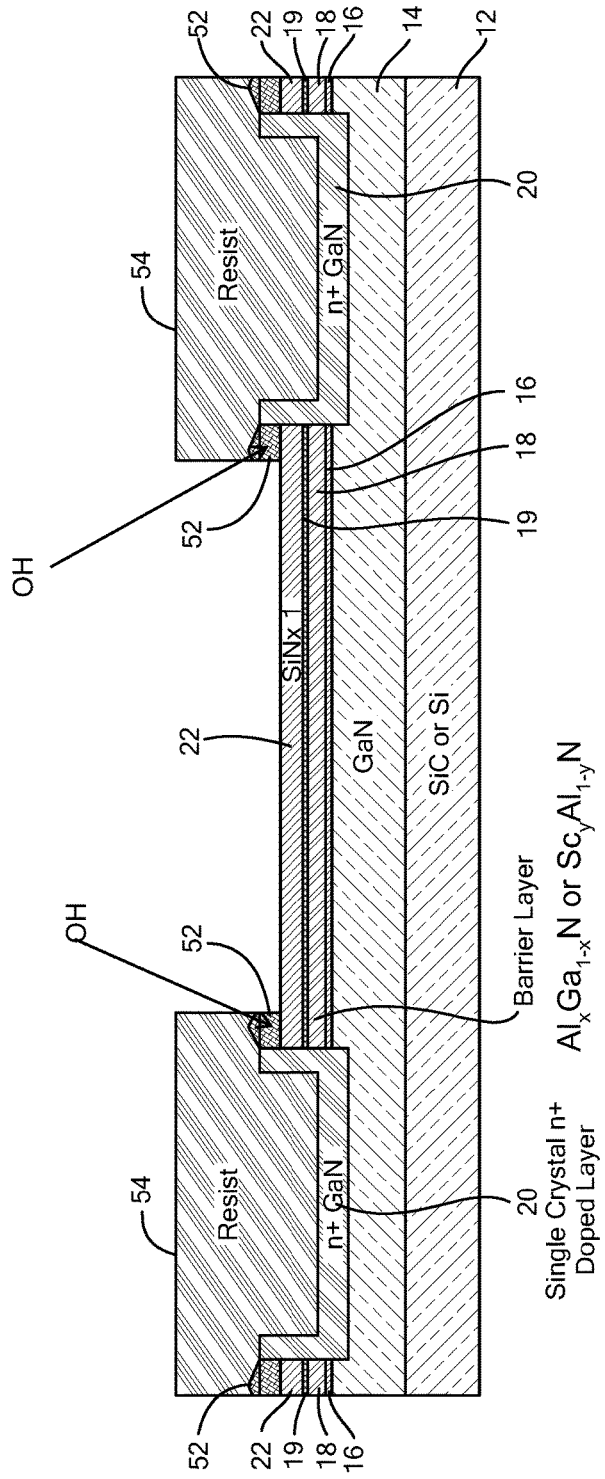

Referring to FIG. 6C, the portions of the polycrystalline layer 52 exposed by the windows are etched away, as shown, here using a chlorine-based plasma dry etch. In this embodiment the formation of poly-crystal layer 52 onto the hard mask regions provided by the remaining unetched portions of layer 22 eliminate any difficulties that may be caused by forming openings into the single crystal material deposited onto the barrier between the source and drain recess regions 29S, 29D of the previous embodiments (such as over-etch into barrier layer 18 during formation of the gate region) as the etch of polycrystal layer 52 to dielectric layer 22 does not impact performance of device $10_3$ (FIG. 5) if process biases and etch selectivities are properly taken into account. The remaining unetched portions polycrystalline layer 52 extending from the edges source and drain recessed regions 29S, 29D, however, form an overhang OH does limit the ultimate scaling of the source/drain gap, though a isotropic (e.g., low DC bias) over etch of polycrystal layer 52 may be employed to laterally etch and remove overhang OH. It is noted that for Silicon-like processed device $10_3$ fabricated in this manner, where the ohmic contacts are subtractively patterned using dry etching post passivation layer deposition, it is advantageous to utilize doped Group III-V layer (n+ epitaxial layer ohmic regrowth) to form the Ohmic contacts instead of metal-based Ohmic contacts. The reason is that if the dielectric layer in contact with the Ohmic metal is also used as the passivation layer, it must not only passivated traps the semiconductor dielectric interface to minimize dispersion, it must also be of suitable quality and density not to allow diffusion of the Ohmic alloy material into the dielectric (which in results in shorting of device $10_3$). As doped Group III-V layer 20 is less reactive with $SiN_x$ during epitaxial growth, it allows a greater diversity of $SiN_x$ passivation films with different characteristics (e.g. different densities, hydrogen content, and compositions) to be deposited and tested as passivation layers.

Figure 6D:
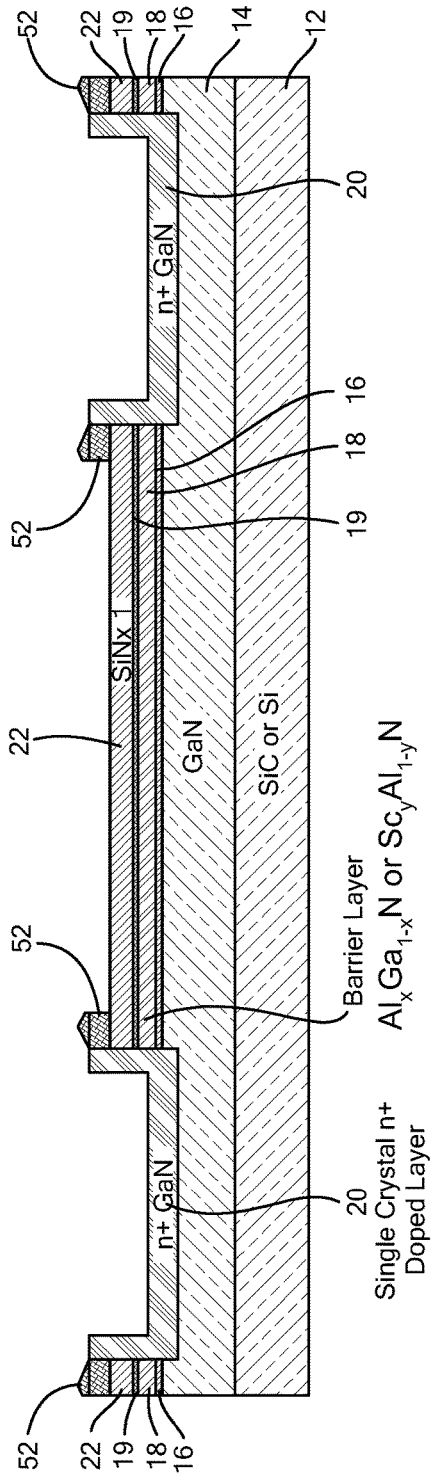

Referring now to FIG. 6D, the photoresist mask 54 is removed, as shown.

Figure 6E:
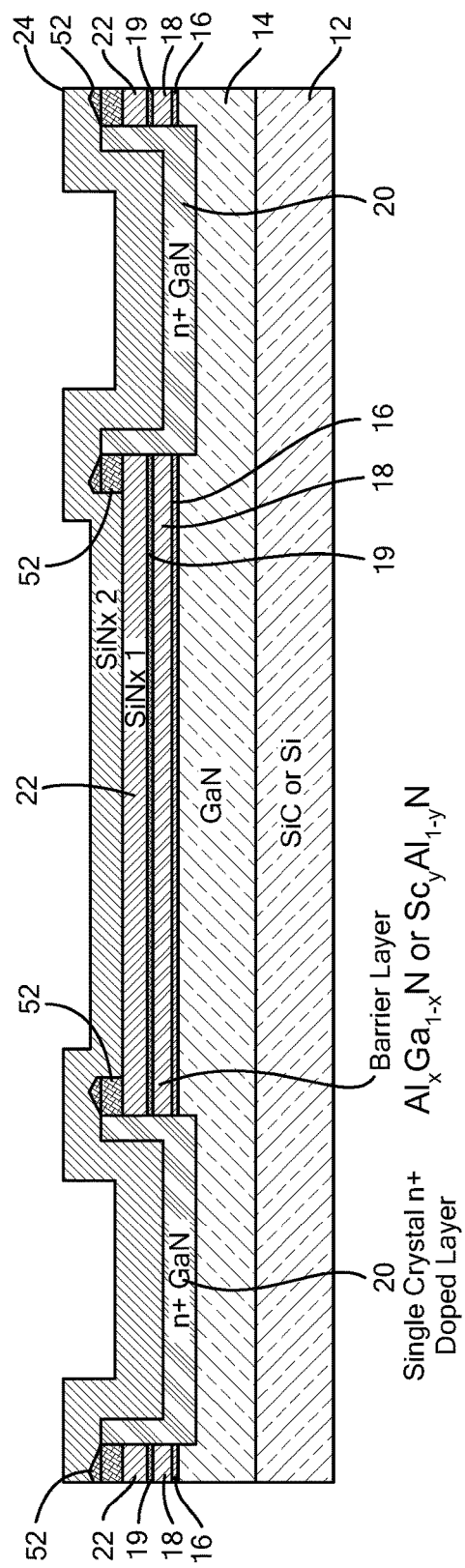

Referring now to FIG. 6E, a dielectric layer 24, here for example $SiN_x$, is deposited over the structure, as shown.

Figure 6F:
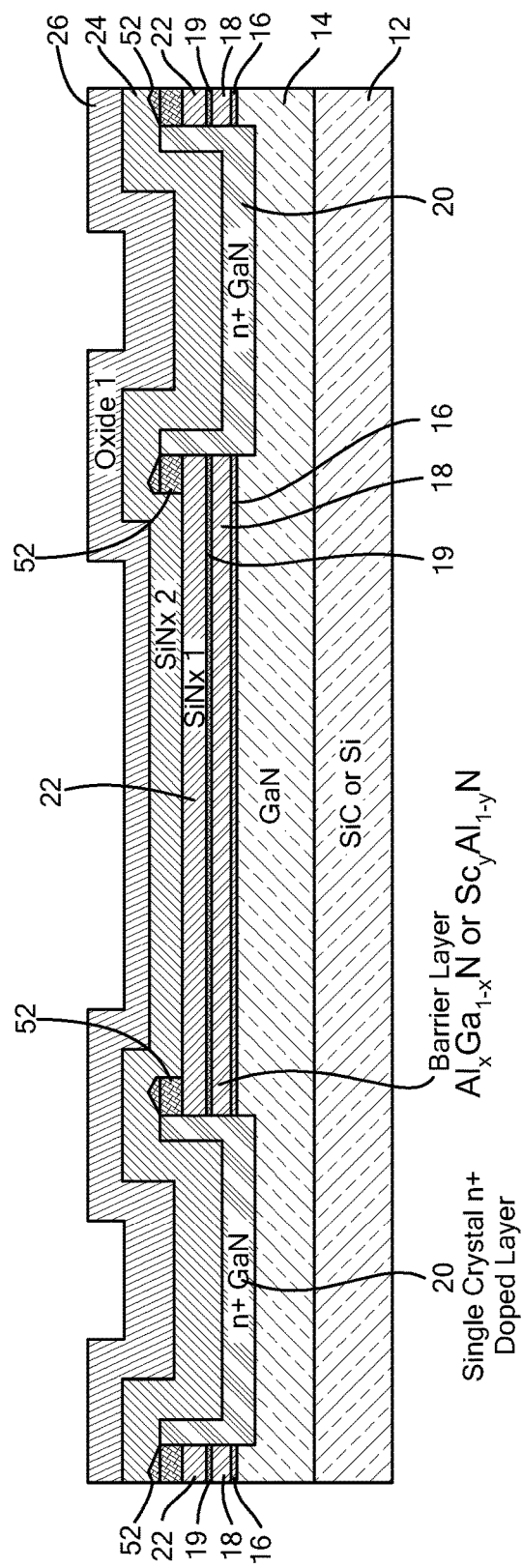

Referring now to FIG. 6F, dielectric layer 26, here for example $SiO_2$, is formed over the structure, as shown. As layer 26 is a lower dielectric constant than layer 24 it serves to reduce the parasitic capacitance of the gate and therefor helps improve high-frequency performance. For applications where the gate length and horizontal upper portion of the electrode 15a can be suitably scaled, in order to reduce parasitic capacitance to meet performance objectives, dielectric layer 26 may be omitted.

Figure 6G:
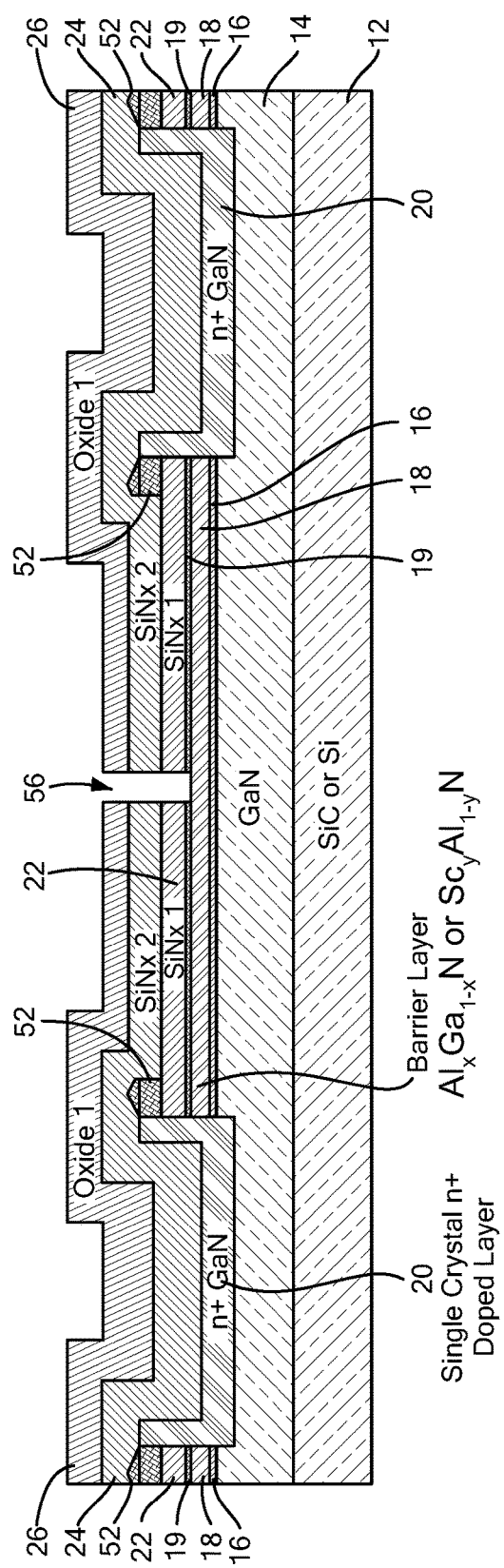

Referring now to FIG. 6G, window 56 is formed through layers using lithographic etching, here for example a fluorine-based plasma dry etch in the region where the gate electrode is to be formed to expose underlying portions of the cap layer 19, or barrier layer 18 (if cap layer 19 is not used or if the gate is recessed using a chlorine-based dry etch) as shown.

Figure 6H:
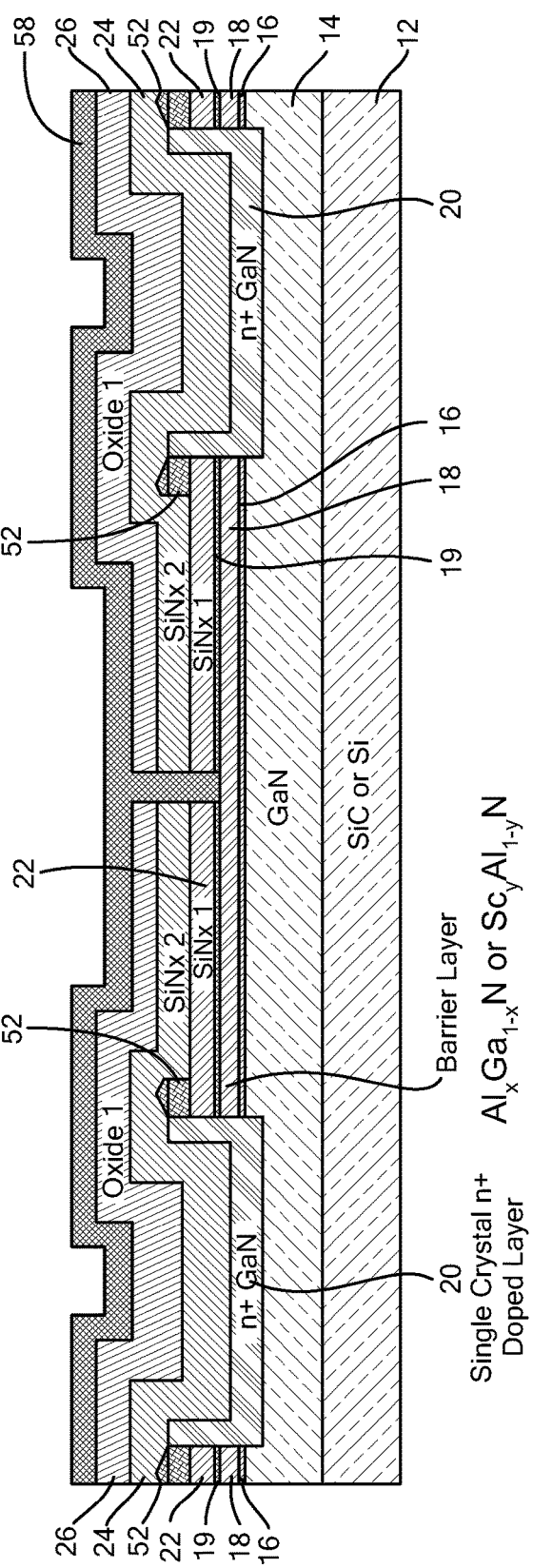

Referring now to FIG. 6H, the gate metal is deposited over the structure in Schottky contact with the exposed portion of cap layer 19 or barrier layer 18, as shown.

Figure 6I:
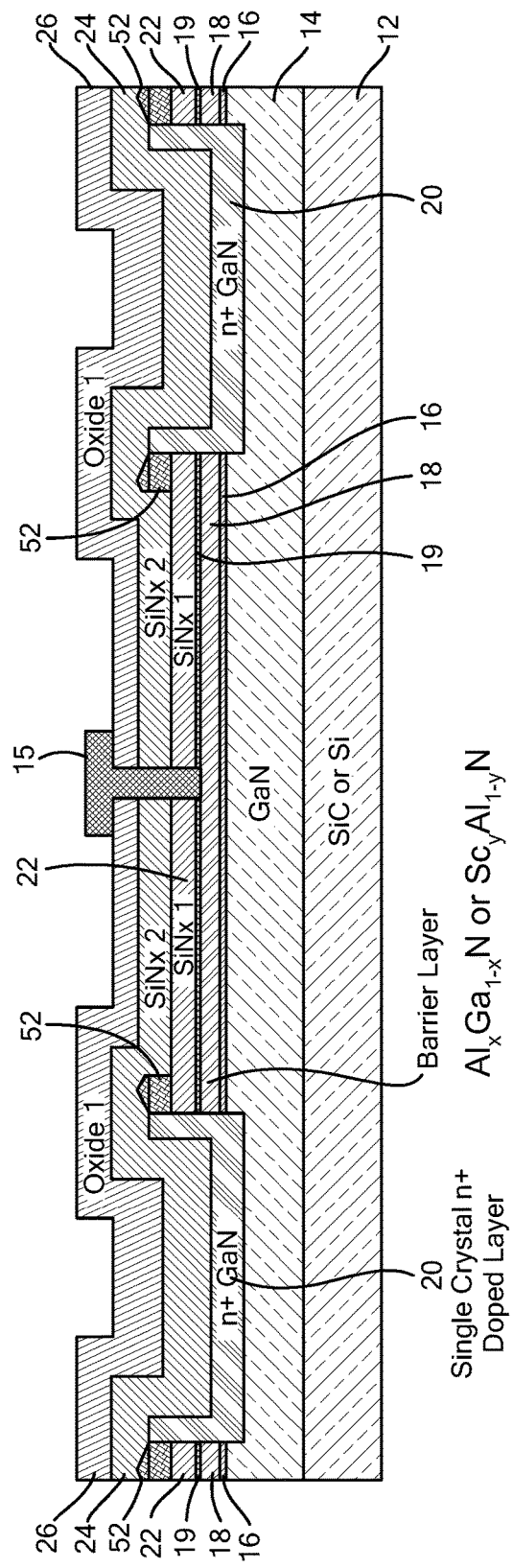

Referring now to FIG. 6I, the gate metal is patterned into the gate electrode 15 as shown using lithographic-etching.

Here for example, gate electrode 15 is a T-gate comprised of TiN, W, TiN/W, Ni, Ta, TaN or a combination thereof. The gate electrode is deposited by any suitable technique such as sputtering (optimized for low damage) or atomic layer deposition (ALD). The electrode is then defined using a subtractive lithographic and etch process, here for example chlorine or fluorine-based plasma dry etch or combination thereof.

The process continues as described above in connection with FIGS. 2K-2Q.

Figure 7:
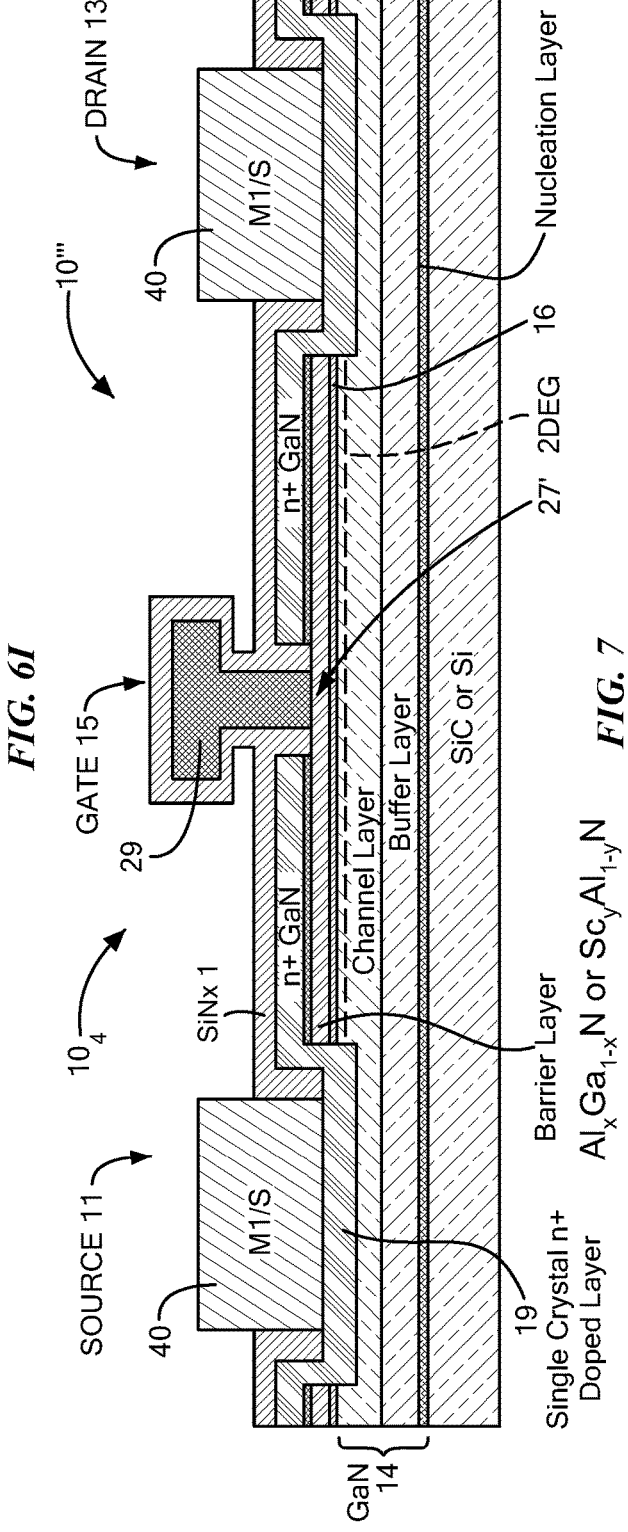
FIG. 7 is a simplified, diagrammatical sketch of a Field Effect Transistor (FET) according to another embodiment of the disclosure.

Referring now to FIG. 7, a semiconductor structure 10''' is shown. Here layer 18 is $Sc_yAl_{1-y}N$ and the source and drain and gate metal electrodes are formed by liftoff-based processing techniques. The process for forming structure 10'' first forms the structure using the process described above in connection with FIGS. 2A-2F.

Figure 8A:
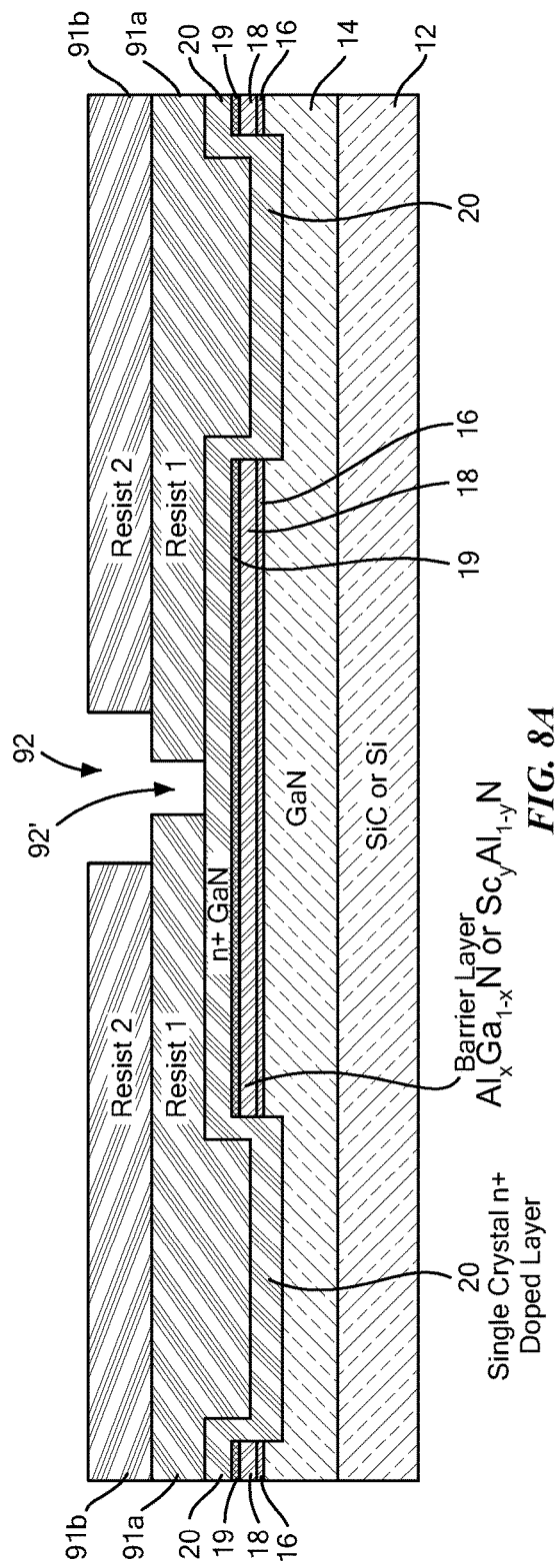

Referring now to FIG. 8A, a multi-layer photoresist pattern is used to define a T-gate structure where the first layer of photoresist 91a forms the gate stem, and is formed over the structure having a window 92 and a second layer of photoresist 91b is formed over the first layer 91a having a smaller window 92' in registration with window 92', as shown. This process uses optical lithography, or electron beam lithography or a combination of both.

Figure 8B:
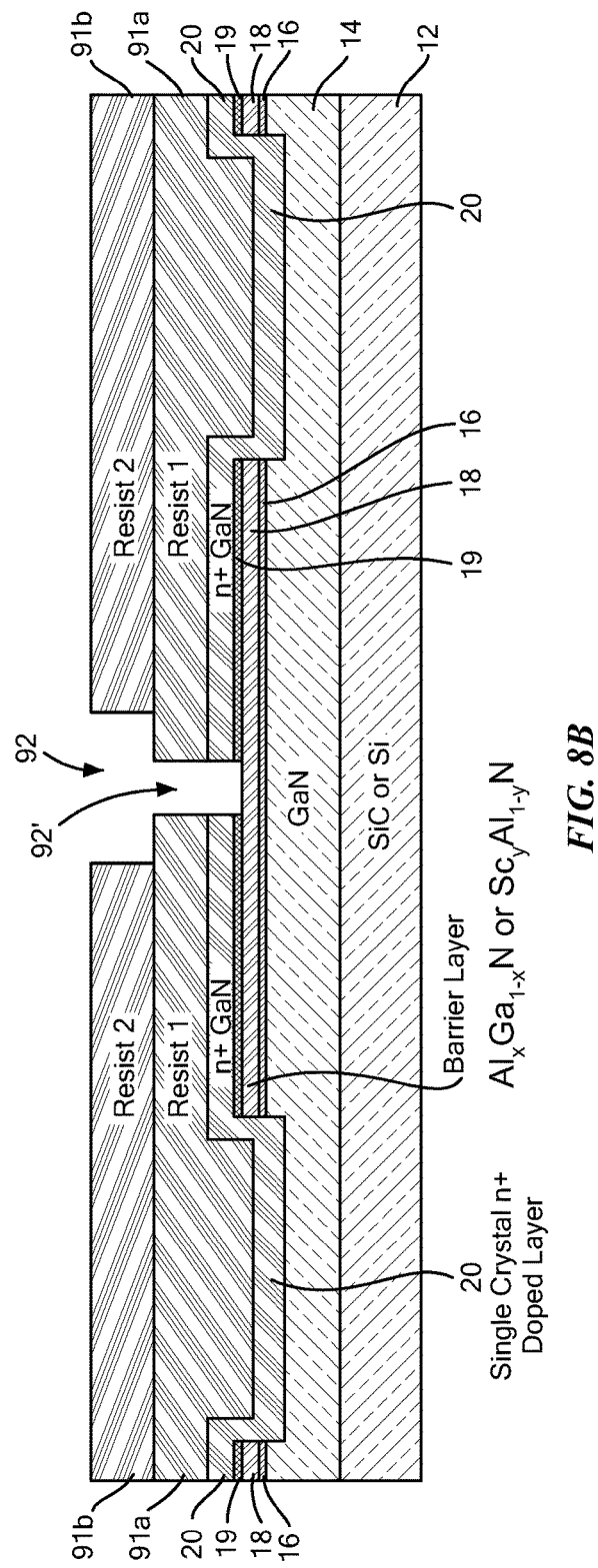

Referring now to FIG. 8B, in a manner similar to FIG. 4D, the structure is dry etched by a chlorine-based dry etch to the remove doped Group III-V layer 20 and cap layer 19 (if present) and expose barrier layer 18. As noted previously, a chlorine-based dry etch can be made selective to the Scandium Aluminum Nitride ($Sc_yAl_{1-y}N$) portion of the barrier layer. Additionally, by using a suitably selective and low power chlorine-based dry etch, an over etch can be employed that laterally etches any III-N layers above the $Sc_yAl_{1-y}N$ portion of the barrier layer. As shown in FIG. 8C, doped Group III-V layer 20 and cap layer 19 are laterally etched to widen the opening 92''.

Referring now to FIG. 8D, the gate metal 96, here for example, Ni/Pt/Au (Nickel/Platinum/Au) is deposited over the structure and in Schottky contact with exposed portions of barrier layer 18, as shown.

Referring now to FIG. 8E, the photoresist layers 91a, 91b are removed thereby lifting off the portions of the gate metal 96 thereon while leaving the portion of the gate metal forming the gate electrode 15, as shown.

Referring now to FIG. 8F, a passivation layer 22, here for example $SiN_x$, is deposited by any suitable technique such as plasma enhanced chemical vapor deposition (PECVD), low pressure chemical vapor deposition (LPCVD), or sputtering over doped Group III-V layer 20, as shown.

Referring now to FIG. 8G, the windows 97 are opened in the dielectric layer 22 above over the doped Group III-V layer 20 in the source and drain recesses are formed in layer, as shown.

Referring again to FIG. 7, the ohmic metal electrode 40, here for example, Ti/Au (Titanium/Gold), Ti/Pt/Au (Titanium/Platinum/Gold), Ti/Al/Ni/Au (Titanium/Aluminum/Nickel/Au), is deposited over the structure and in Ohmic contact with doped Group III-V layer 20, as shown. If alloying is needed to facilitate better Ohmic contact formation between layer 40 and doped Group III-V layer 20, then layer 40 is deposited and alloyed prior to gate electrode 15 formation and dielectric layer 22 deposition. The result is a liftoff processed HEMT with a gate that self-aligned in the opening 92 (FIG. 8A). Minimizing the width of opening 92 helps minimize dispersion (also known as current collapse) under large signal conditions caused by trapped charges in the high field portion of the gate to drain region. These trapped charges are located at the interface of barrier layer 18 and dielectric layer 22 and in the buffer layer 14b near the active region of device $10_4$ (FIG. 7) and lead to reduced current and therefore power output of a high frequency HEMT as trapped negative charges act as a parasitic gate that is negatively biased. As discussed previously, dispersion is expected to be minimized as the doped Group III-V layer 20 provides a shorter leakage path for the surface and buffer traps to discharge than would otherwise be provided by a leakage path to the drain electrode in the absence of a horizontal portion of doped Group III-V layer 20, that extends (as part of the epitaxial structure of device $10_4$) from the drain electrode 40 into the EXTRINSIC DRAIN REGION of device $10_4$ to the edge of the GAP (opening 92''') that is located on the drain side of gate electrode 15. However, reducing the width of opening 92'', while minimizing current collapse, will also reduce the breakdown voltage of device $10_4$ as the lateral spreading of the high field depletion region on the drain side of the gate will likely become constrained by doped Group III-V layer 20 in EXTRINSIC DRAIN REGION at the edge of opening 92'''. As a result, the size of the opening must be optimized for a given application to maximize output power by achieving the optimal balance between dispersion and breakdown/operating voltage. It should be noted that performance could be enhanced further by recessing the gate electrode 15 into the upper portion of barrier layer 18 by using a less selective chlorine-based dry etch, to recess the gate opening 92 before switching over to the more selective dry etch to widen (laterally) opening 92''. As mentioned previously, this gate recess of resulting gate electrode 15 can be used to optimize device $10_4$ pinchoff, and transconductance characteristics for high frequency. It can also be used to minimize or eliminate short channel effects in short gate length device $10_4$ structures. Under some bias conditions, at a given recess etch depth into barrier layer 18, the recessed gate electrode 15 may also help reduce dispersion related to surface trapping as has been demonstrated in InP HEMTs.

Figure 9B:
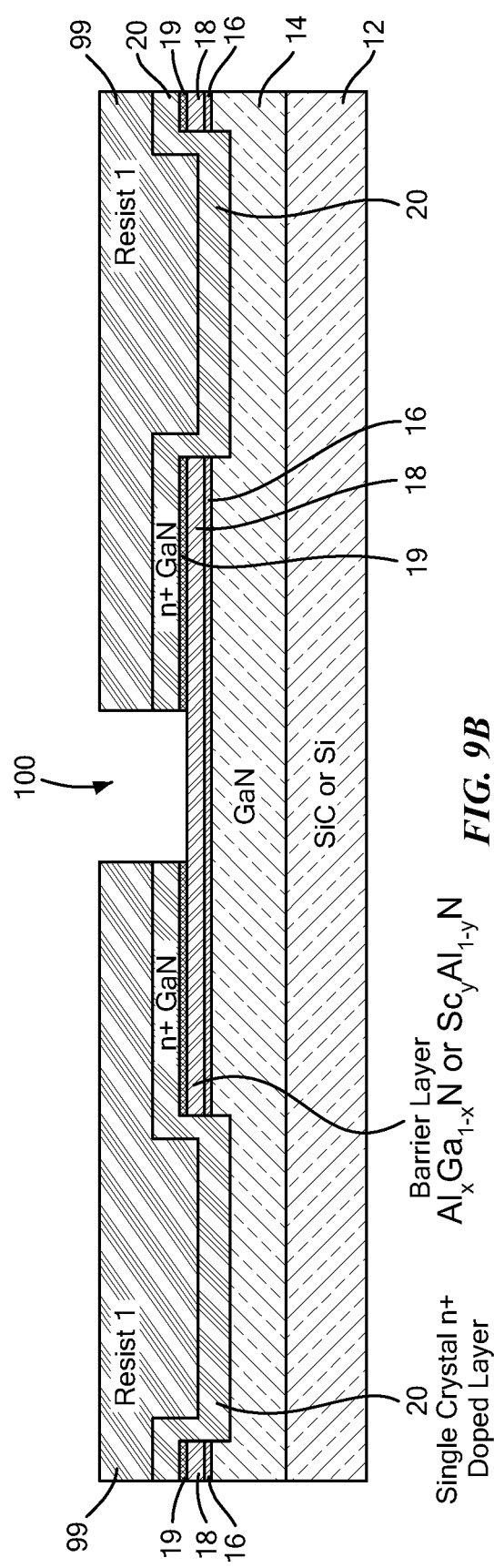
Figure 9C:
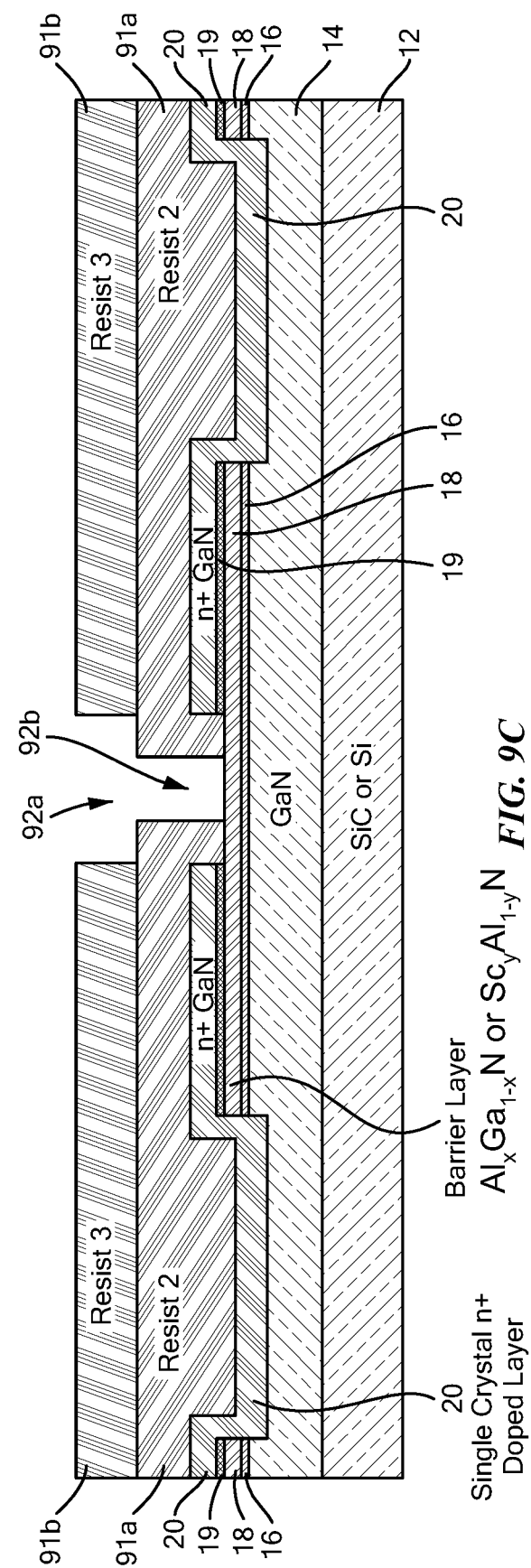

Another method which may be used to form the structure 10' (FIG. 7) is as follows: photoresist layer with window 100 is used to remove portions of doped Group III-V layer 20 and cap layer 19, if used, to expose portions of barrier layer 18 is to be used for the gate 15, as shown in FIG. 9B. Photoresist layers 91a, 91b are formed with the window 92 to expose portions of the $Sc_yAl_{1-y}N$ or $Al_xGa_{1-x}N$ barrier layer 18 where the gate electrode 15 is to be formed, as shown in FIGS. 9A, 9B and 9C. Gate electrode 15 formation and liftoff, dielectric layer 22 deposition, and Ohmic electrode 40 formation and liftoff proceed at described previously in conjunction with FIG. 7 and FIGS. 8A-8G with the exception that the lateral selective over etch is not used.

A number of embodiments of the disclosure have been described. Nevertheless, it will be understood that various modifications may be made without departing from the spirit and scope of the disclosure. For example, additional metal layers can be deposited on the doped Group III-V layer 20 and disposed under the source and drain electrodes 11 and 13 or 14 such that the spreading resistance of current from the electrodes to through doped Group III-V layer 20 is reduced. Additionally, sputtering may be used in conjunction perhaps with n+ ion implantation and subsequent activation anneal to form doped Group III-V layer 20. Sputtering this layer would result in polycrystal material, but through optimization, suitable morphology may be obtained to provide many of the same benefits of the single-crystal approach to doped Group III-V layer 20. More or fewer dielectric layers and different dielectric materials could be used than specified here (such as $Al_2O_3$ or $HfO_2$) as passivation, interlayer dielectrics, and to form insulated gate HEMTs. Other III-N barrier layers could be used such as $In_xAl_{1-x}N$ or Boron Aluminum Nitride ($B_xAl_{1-x}N$). The doped Group III-V layer could comprise, or be replaced by, III-V materials such as aluminum (AlN) or indium nitride (InN). In the case of AlN, a thin un-doped AlN layer could comprise the entire ohmic contact layer and function as a tunnel junction. Epitaxial techniques such as selective crystalline ALD or selective MOCVD could be employed for material growth. Further, the soft mask 43 need not be typically used photoresists, here for example AZ P4330, and electron beam resists, here for example polymethyl methacrylate (PMMA), but is meant to included other organic "soft" resist materials, here for example benzocyclobutene (BCB), or polymethlglutarimide (PMGI). These materials tend to be etched easily by oxygen, fluorine, chlorine or other reactive gases to the extent that a defined pattern can be rapidly degraded during plasma etching. It should also be noted that these concepts are also applicable to other III-V material system HEMT device 10s, here for example gallium arsenide (GaAs)-based pseudomorphic HEMTs (PHEMTs), and indium phosphide (InP)-based HEMTs and InP-like metamorphic HEMTs (MHEMTs). Accordingly, other embodiments are within the scope of the following claims.

What is claimed is:

1. A semiconductor device, comprising:
   an epitaxial group III-V channel layer;
   an epitaxial Group III-V barrier layer disposed over the channel layer;
   a source recess region and drain recess region extending vertically through the barrier layer and into the channel layer;
   a doped Group III-V ohmic contact layer disposed directly on bottom and inner sidewalls of the source recess and the drain recess, the doped ohmic contact layer being of the same material as the channel layer, the doped ohmic contact layer having a portion extending horizontally on the barrier layer and having a gap therein between the source recess and the drain recess;
   a gate electrode disposed in the gap and on the barrier layer, the gate electrode having a lower, vertically extending stem portion; and
   a dielectric structure disposed over the ohmic contact layer and over the barrier layer and extending continuously from a region over the source recess to one side of the stem portion and then extending continuously from an opposite side of the stem portion to a region over the drain recess, a first portion of the dielectric structure being in contact with the stem portion and the barrier layer, a second portion of the dielectric structure within the source recess and the drain recess.

2. The semiconductor device recited in claim 1 wherein the dielectric structure includes: a first dielectric layer disposed on and extending over the horizontally extending ohmic contact layer and being in contact with the stem portion; and a second dielectric layer disposed on the first dielectric layer and of a material different from the first dielectric layer and in contact with the stem portion and the bottom of a horizontal portion of the gate electrode.

3. The semiconductor device recited in claim 1 wherein the dielectric structure comprises:
   a first dielectric layer;
   a second dielectric layer; and
   a third dielectric layer;
   wherein the first dielectric layer is disposed on and extends over the horizontally extending ohmic contact layer and is in contact with the third dielectric layer,
   wherein the third dielectric layer is in contact with the stem portion, and
   wherein the second dielectric layer is disposed on the first and third dielectric layers and has a material different from the first dielectric layer and is in contact with the stem portion and the bottom of the horizontal portion of the gate electrode.

4. The semiconductor device recited in claim 1 wherein the dielectric structure is disposed on the barrier layer and is in contact with sides of the stem portion and under, and in contact with a bottom portion of a horizontal portion, the bottom portion of the horizontal portion being at a vertical elevation higher than a top surface of the horizontally extending portion of the ohmic contact layer.

5. The semiconductor device recited in claim 1 wherein the doped Group III-V ohmic contact layer in contact with the source and drain recesses and the barrier layer and a field region is single crystal material.

6. The semiconductor device recited in claim 1 wherein, a portion of the doped Group III-V ohmic contact layer in direct contact with a portion of the dielectric structure is polycrystal while a portion of the group III-V ohmic contact layer in the source and drain recesses is single crystal.

7. The semiconductor device recited in claim 1 wherein the channel layer and the doped Group III-V ohmic contact layer comprise GaN.

8. The semiconductor device recited in claim 2 wherein the barrier layer comprises $Al_xGa_{1-x}N$ where x is between 0 and 1.

9. The semiconductor device recited in claim 2 wherein the barrier layer comprises $Sc_yAl_{1-y}N$ where y is between 0 and 0.5.

10. The semiconductor device recited in claim 1 wherein, a portion of the doped Group III-V ohmic contact layer in direct contact with a portion of the dielectric structure and in the source and drain regions is polycrystal.

11. The semiconductor device recited in claim 1 wherein the doped Group III-V ohmic contact layer comprises AlN.

12. The semiconductor device recited in claim 1 wherein the doped Group III-V ohmic contact layer comprises InN.

13. The semiconductor device recited in claim 1 wherein the barrier layer comprises $Al_xGa_{1-x}N$ where x is between 0 and 1.

14. The semiconductor device recited in claim 1 wherein the barrier layer comprises $Sc_yAl_{1-y}N$.

15. The semiconductor device recited in claim 1 wherein the barrier layer comprises $B_xAl_{1-x}N$.

16. The semiconductor device recited in claim 1 wherein the barrier layer comprises $Sc_yAl_{i-y}N$, where y is $\geq 0.18$.

* * * * *